(12) United States Patent
Lee et al.

(10) Patent No.: US 12,733,547 B2
(45) Date of Patent: Sep. 8, 2026

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Yongkoon Lee, Suwon-si (KR); Youngchan Ko, Suwon-si (KR); Byungho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 489 days.

(21) Appl. No.: 18/298,702

(22) Filed: Apr. 11, 2023

(65) Prior Publication Data

US 2024/0014197 A1 Jan. 11, 2024

(30) Foreign Application Priority Data

Jul. 8, 2022 (KR) ........................ 10-2022-0084293

(51) Int. Cl.
*H01L 25/18* (2023.01)
*H10B 80/00* (2023.01)
(Continued)

(52) U.S. Cl.
CPC ............ *H10W 90/00* (2026.01); *H10B 80/00* (2023.02); *H10W 20/042* (2026.01);
(Continued)

(58) Field of Classification Search
None
See application file for complete search history.

(56) References Cited

U.S. PATENT DOCUMENTS 8,349,649 B2 1/2013 Kurita
9,516,740 B2 12/2016 Lee et al.
(Continued)

FOREIGN PATENT DOCUMENTS

CN 107305849 A 10/2017
KR 10-2020-0132511 A 11/2020
KR 10-2022-0001643 A 1/2022

OTHER PUBLICATIONS

Extended European Search Report in European Appln. No. 23182938.3, mailed on Nov. 28, 2023, 7 pages.
(Continued)

*Primary Examiner* — Long Pham
(74) *Attorney, Agent, or Firm* — Fish & Richardson P.C.

(57) ABSTRACT

A semiconductor package includes: a substrate including a redistribution member having a first surface and a second surface, opposing each other, and including pad structures disposed on the first surface and a redistribution layer electrically connected to the pad structures, an interconnect chip disposed on the second surface of the redistribution member and including an interconnect circuit electrically connected to the redistribution layer, a via structure disposed around the interconnect chip and electrically connected to the redistribution layer, an encapsulant encapsulating at least a portion of each of the interconnect chip and the via structure, and bump structures disposed on the encapsulant; and a first chip structure and a second chip structure disposed on the first surface of the redistribution member and electrically connected to the pad structures.

15 Claims, 19 Drawing Sheets

(51) Int. Cl.

| | |
|---|---|
| ***H10W 20/00*** | (2026.01) |
| ***H10W 70/63*** | (2026.01) |
| ***H10W 74/10*** | (2026.01) |
| ***H10W 90/00*** | (2026.01) |
| *H10W 72/00* | (2026.01) |
| *H10W 72/20* | (2026.01) |

(52) U.S. Cl.

CPC ........ *H10W 70/635* (2026.01); *H10W 74/114* (2026.01); *H10W 90/401* (2026.01); *H10W 72/01236* (2026.01); *H10W 72/244* (2026.01); *H10W 90/724* (2026.01)

(56) References Cited

U.S. PATENT DOCUMENTS

| | | | | |
|---|---|---|---|---|
| 9,741,664 | B2 | 8/2017 | Chiu et al. | |
| 10,515,898 | B2 | 12/2019 | Tsuyutani et al. | |
| 10,559,525 | B2 | 2/2020 | Yu | |
| 11,088,131 | B2 | 8/2021 | Chen et al. | |
| 11,217,534 | B2 * | 1/2022 | Xu | H01L 23/3128 |
| 11,862,574 | B2 * | 1/2024 | Kim | H01L 23/49816 |
| 2006/0226527 | A1 | 10/2006 | Hatano et al. | |
| 2021/0407962 | A1 * | 12/2021 | Kim | H01L 23/5385 |
| 2022/0045008 | A1 * | 2/2022 | Kang | H01L 21/4857 |

OTHER PUBLICATIONS

Office Action in Korean Appln. No. 10-2022-0084293, mailed on Jun. 2, 2026, 20 pages (with English translation).

* cited by examiner

SEMICONDUCTOR PACKAGE AND METHOD OF MANUFACTURING THE SAME

CROSS-REFERENCE TO RELATED APPLICATION(S)

This application claims benefit of priority to Korean Patent Application No. 10-2022-0084293 filed on Jul. 8, 2022, in the Korean Intellectual Property Office, the disclosure of which is incorporated herein by reference in its entirety.

BACKGROUND

The present disclosure relates to a semiconductor package and a method of manufacturing the same.

Semiconductor devices, installed in electronic apparatuses, are required to have high performance and high capacity as well as miniaturization. To implement such requirements, a system-in-package (SiP) technology for interconnecting heterogeneous semiconductor chips to a single semiconductor package has been developed.

SUMMARY

The subject matter of the present disclosure relates to a semiconductor package having improved reliability and yield and a method of manufacturing the same.

In general, innovative aspects of the subject matter described in this disclosure can be embodied in a semiconductor package including: a substrate including a redistribution member having a first surface and a second surface, opposing each other, and including pad structures disposed on the first surface and a redistribution layer electrically connected to the pad structures, an interconnect chip disposed on the second surface of the redistribution member and including an interconnect circuit electrically connected to the redistribution layer, a via structure disposed around the interconnect chip and electrically connected to the redistribution layer, an encapsulant encapsulating at least a portion of each of the interconnect chip and the via structure, and bump structures disposed on the encapsulant; and a first chip structure and a second chip structure disposed on the first surface of the redistribution member and electrically connected to the pad structures. The bump structures may include a first bump structure, overlapping at least a portion of the interconnect chip in a first direction, perpendicular to the second surface, and a second bump structure overlapping at least a portion of the via structure. The first bump structure may include a first foil layer, disposed on the encapsulant, and a first plating layer disposed on the first foil layer. The second bump structure may include a second foil layer, disposed on the encapsulant, and a second plating layer disposed in an opening penetrating through the second foil layer to expose at least a portion of the via structure.

Other aspects of this disclosure can be embodied in a semiconductor package including: a substrate including a redistribution member having a first surface and a second surface, opposing each other, and including a redistribution layer, an interconnect chip disposed on the second surface of the redistribution member and including an interconnect circuit electrically connected to the redistribution layer, a via structure disposed around the interconnect chip and electrically connected to the redistribution layer, an encapsulant encapsulating at least a portion of each of the interconnect chip and the via structure, and bump structures disposed on the encapsulant; and a first chip structure and a second chip structure disposed on the first surface of the redistribution member and electrically connected to the redistribution layer. The bump structures may include a foil layer contacting the encapsulant, a seed layer contacting the foil layer, and a metal layer contacting the seed layer, and a metal layer contacting the seed layer. The foil layer, the seed layer, and the metal layer may include the same material.

Other aspects of this disclosure can be embodied in a semiconductor package including: a base substrate including a wiring circuit; an interposer substrate disposed on the base substrate; and a first chip structure and a second chip structure disposed on the interposer substrate. The interposer substrate may include a redistribution member having a first surface, directed toward the first and second chip structures, and a second surface, directed toward the base substrate, and including a first pad structure and a second pad structure disposed on the first surface, an interconnect chip disposed on the second surface of the redistribution member and electrically connected to the first pad structures, a via structure disposed around the interconnect chip and electrically connected to the second pad structures, an encapsulant covering at least a portion of each of the interconnect chip and the via structure, a first bump structure disposed on the encapsulant and overlapping at least a portion of the interconnect chip, and second bump structures disposed around the first bump structure. A width of the first pad structures may be substantially the same as a width of the second pad structures. The second bump structure may include a second plating layer extending inwardly of the encapsulant to contact the via structure.

Other aspects of this disclosure can be embodied in a method of manufacturing a semiconductor package including: attaching a via structure and an interconnect chip to a tape; forming an encapsulant, encapsulating the interconnect chip and the via structure, on the tape using a carrier in which a preliminary foil layer and a preliminary encapsulant are stacked; removing the tape and forming a redistribution member on the interconnect chip and the via structure; removing the carrier and forming an opening penetrating through the preliminary foil to expose at least a portion of the via structure; and forming a preliminary seed layer on a surface of the preliminary foil layer and in the opening; forming a metal layer on the preliminary seed layer using a patterned photosensitive material layer; and removing the photosensitive material layer and etching the preliminary seed layer and the preliminary foil layer, exposed from the metal layer, to form a seed layer and a foil layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example implementations will be described with reference to the accompanying drawings.

Figure 1A:
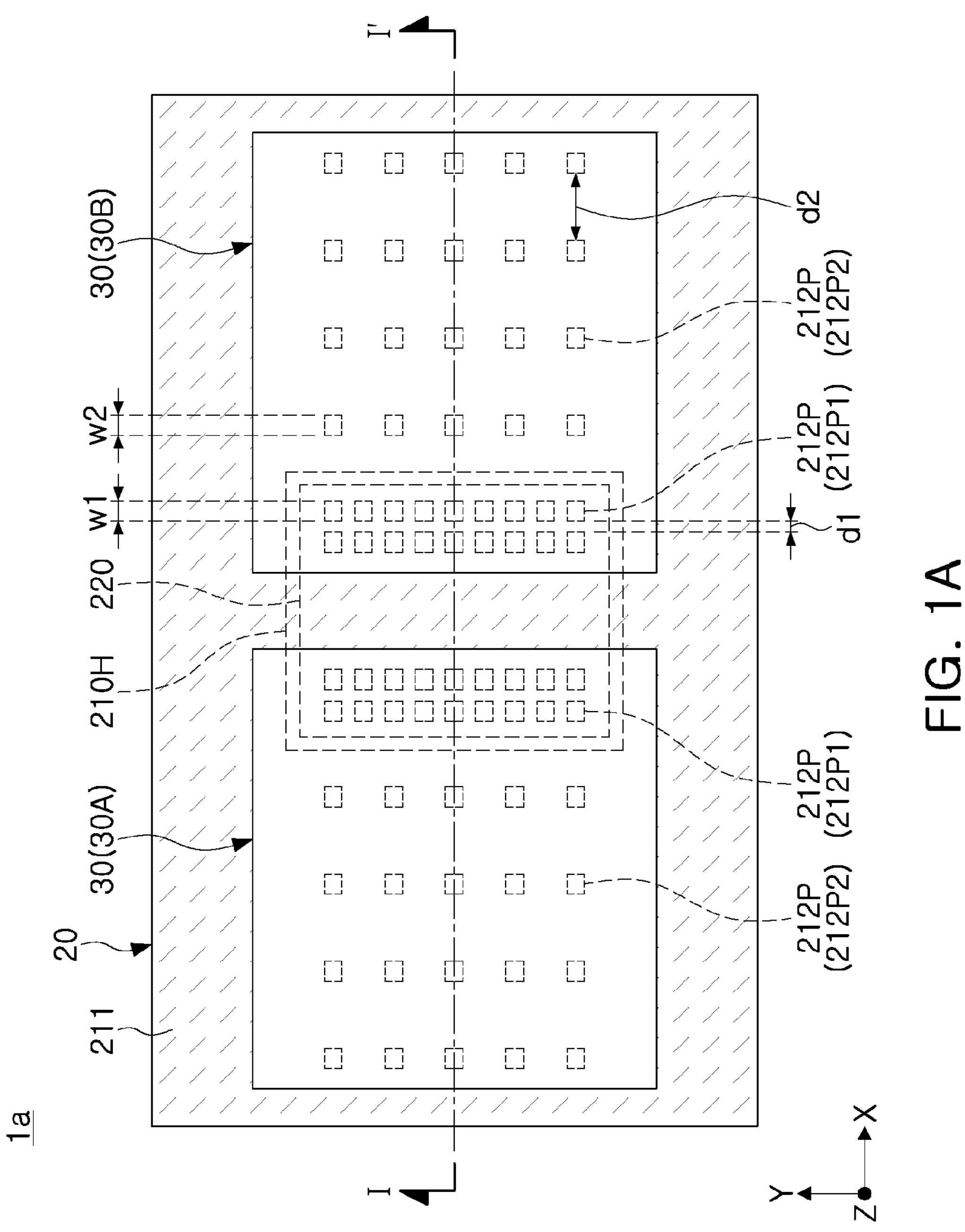
FIG. 1A is a plan view of an example of a semiconductor package.
Figure 1B:
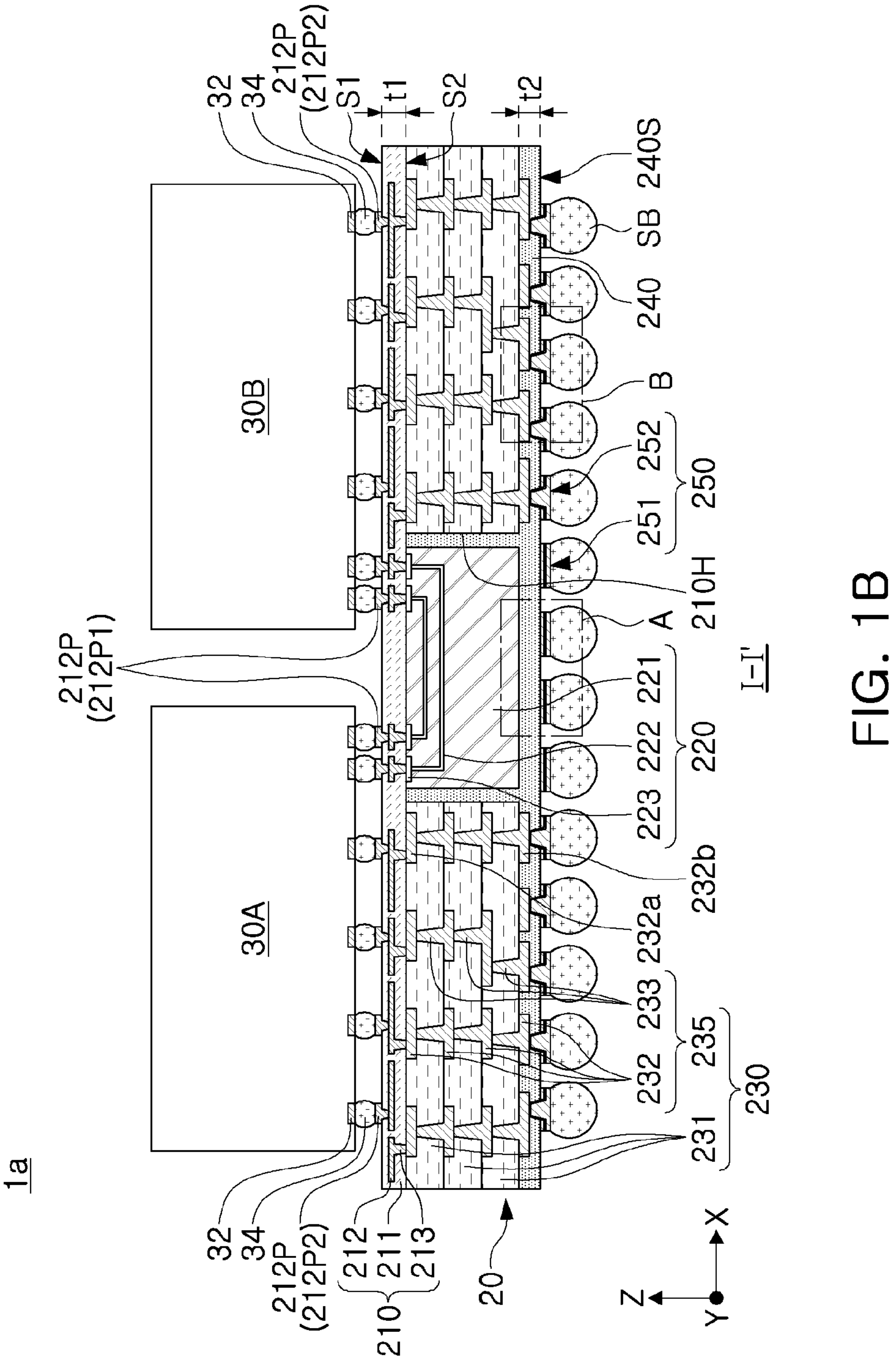
FIG. 1B is a cross-sectional view taken along line I-I' of FIG. 1A.
Figure 2:
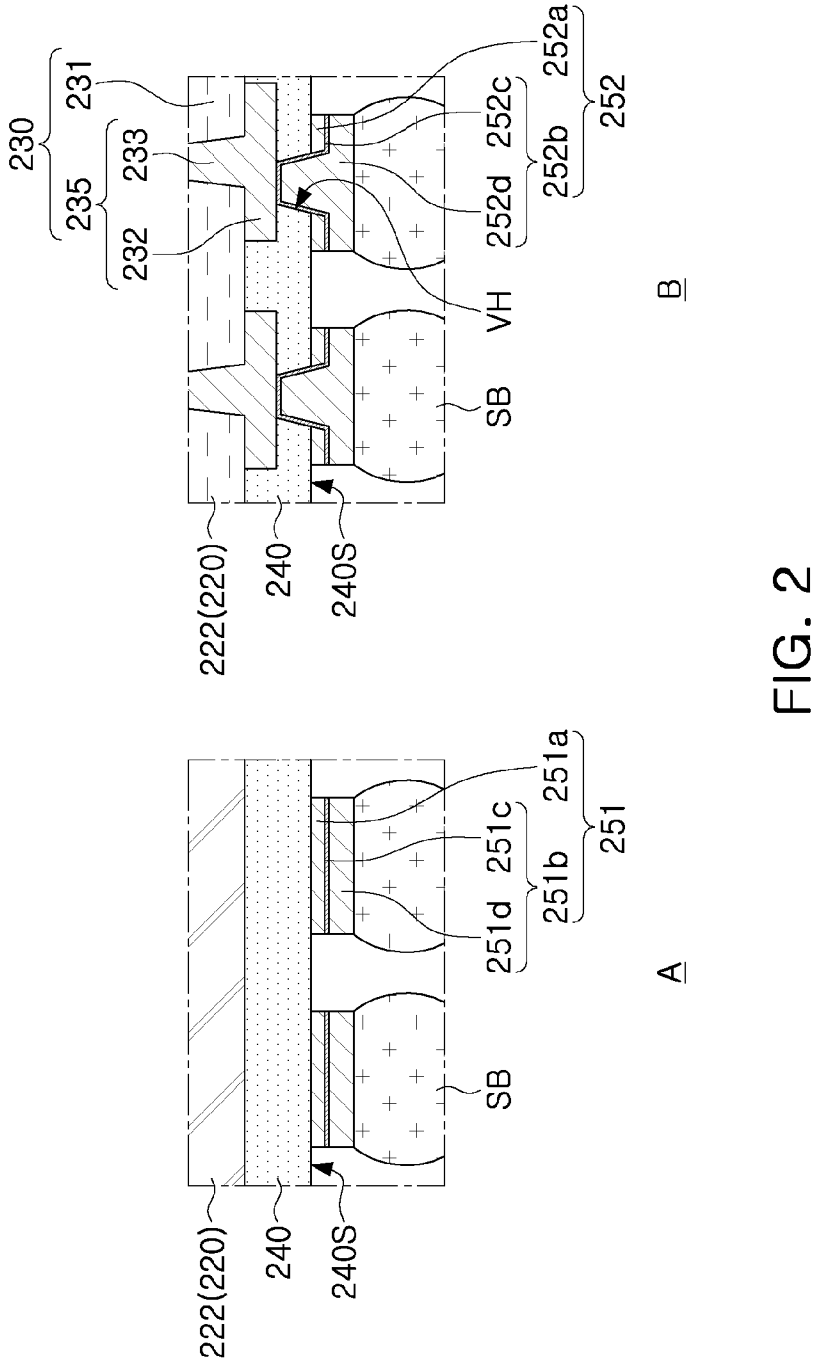
FIG. 2 is a partially enlarged view of region “A” and region “B” of FIG. 1B.

FIG. 1A is a plan view of an example of a semiconductor package 1*a*, FIG. 1B is a cross-sectional view taken along line I-I' of FIG. 1A, and FIG. 2 is a partially enlarged view of region "A" and region "B" of FIG. 1B.

Referring to FIGS. 1A and 1B, a semiconductor package 1*a* may include a substrate 20 (or an "interposer substrate") and chip structures 30. In the present disclosure, thicknesses of resin layers formed above and below the interconnect chip 220 may be controlled to significantly reduce warpage of the substrate 20. For example, a thickness t2 of a resin layer (hereinafter referred to as an "encapsulant 240") covering a lower surface of the interconnect chip 220 and a thickness t1 of a resin layer (hereinafter referred to as a "dielectric layer 211") covering an upper surface of the interconnect chip 220 may be at a similar level, so that the warpage of the substrate may be suppressed and reliability and yield of the semiconductor package 1*a* may be improved. As used herein, "similar level" means that thicknesses of two resin layers are substantially the same or a difference in the thicknesses between the two resin layers is within a predetermined level. For example, the thickness t2 of the encapsulant 240 covering the lower surface of the interconnect chip 220 (or a lower surface of a via structure 235) may range from about 80% to about 120% of the thickness t2 of the dielectric layer 211 covering the upper surface of the interconnect chip 220. The thickness t1 may range from, but is not limited to, about 5 μm to about 30 μm, from about 10 μm to about 30 μm, from about 20 μm to about 30 μm, or the like.

According to the present disclosure, bump structures having a triple-layer structure 250 may be formed below the encapsulant 240 by a manufacturing process for reducing the thickness t2 of the encapsulant 240 (see FIGS. 10D to 10H). First bump structures 251 in a fan-in region, e.g., above the interconnect chip 220, can have a different shape compared to second bump structures 252 in a fan-out region, e.g., not above the interconnect chip 220, which allows the second bump structures 252 to contact the via structure 235 while being compatible with the reduced thickness t2 of the encapsulant 240. The bump structures 250 will be described in detail later with reference to FIG. 2.

The substrate 20 may include a redistribution member 210, an interconnect chip 220, a connection member 230, an encapsulant 240, and bump structures 250.

The redistribution member 210 may have a first surface S1 and a second surface S2 opposing each other, and may include a dielectric layer 211, a redistribution layer 212, and a redistribution via 213. Also, the redistribution member 210 (or the redistribution layer 212) may include pad structures 212P disposed on the first surface S1.

The dielectric layer 211 may include a thermosetting resin such as an epoxy resin, a thermoplastic resin such as polyimide, a resin in which the thermosetting resin or the thermoplastic resin is mixed with an inorganic filler, for example, prepreg, Ajinomoto Build-up Film (ABF), Frame Retardant 4 (FR-4), Bismaleimide Triazine (BT), a photo-imageable dielectric (PID), or the like. The dielectric layer 211 may include a plurality of layers, and boundaries between the respective layers may be distinct. However, the boundaries between the respective layers may not be distinct according to a process.

The redistribution layer 212 may be disposed on or in the dielectric layer 211, and may electrically connect the interconnect chip 220, the via structure 235, and the chip structures 30 to each other. The redistribution layer 212 may substantially redistribute a pad 32 of the chip structures 30. As an example, the pad 32 may be connected to the pad structures 212P through solder bumps 34. The redistribution layer 212 may include a metal material including, for example, copper (Cu), aluminum (Al), silver (Ag), tin (Sn), gold (Au), nickel (Ni), lead (Pb), titanium (Ti), or alloys thereof. The redistribution layer 212 may include a ground (GND) pattern, a power (PWR) pattern, and a signal (S) pattern depending on a design thereof. The signal (S) pattern may provide a transmission path of various signals, other than the ground (GND) pattern, the power (PWR) pattern, or the like.

The pad structures 212P may be disposed on the first surface S1 and may electrically connect the chip structures 30 and the redistribution layer 212 to each other. The pad structures 212P include a pad portion (PP of FIG. 10C), disposed on the dielectric layer 211, and a via portion (VP of FIG. 10C) extending inwardly of the dielectric layer 211 to connect the pad portion to the redistribution layer 212 (see FIG. 10C). Also, the pad structures 212P may include a surface layer, not illustrated, (see SF of FIG. 10C) disposed on the pad portion (PP of FIG. 10C) adjacent to the first surface S1. The surface layer, not illustrated, may include nickel (Ni), gold (Au), or an alloy thereof.

The pad structures 212P may include first pad structures 212P1, electrically connected to interconnect circuit 222 through redistribution layer 212, and second pad structures 212P2 electrically connected to the via structure 235. Since the first pad structures 212P1 and the second pad structures 212P2 are formed in the same manufacturing process, the first pad structures 212P1 and the second pad structures 212P2 may have substantially the same size. As an example, a width w1 of the first pad structures 212P1 in a direction (an X-direction), parallel to the first surface S1, may be substantially the same as a width w2 of the second pad structures 212P2 in the direction.

The chip structures 30 may be electrically connected to each other through the first pad structures 212P1 and the interconnect circuit 222, and may be electrically connected to the bump structures 250 through the second pad structures 212P2 and the via structure 235. Accordingly, the first pad structures 212P1 may be arranged at a fine pitch corresponding to a pitch of the pads 32 for interconnecting the chip structures 30. For example, a first distance d1 between the first pad structures 212P1 adjacent to each other may be shorter than a second distance d2 between the second pad structures 212P2 adjacent to each other. The first distance d1 may be within a range of about 60 μm or less, for example, a range of about 10 μm to about 60 μm, about 20 μm to about 60 μm, about 20 μm to about 50 μm, about 20 μm to about 40 μm, or the like, and the second distance d2 may be within a range of about 60 μm or more, for example, a range of about 60 μm to about 100 μm, about 70 μm to about 100 μm, or the like.

The redistribution via 213 may electrically connect the redistribution layer 212 to the via structure 235 and the interconnect chip 220 to form an electrical path connecting an upper portion and a lower portion of the substrate 20 to each other. The redistribution via 213 may include a signal via, a ground via, or a power via. The redistribution via 213 may include a metal material including, for example, copper (Cu), aluminum (Al), silver (Ag), tin (Sn), gold (Au), nickel (Ni), lead (Pb), titanium (Ti), or alloys thereof. The redistribution via 213 may be a filled via, filled with a metal material in a via hole, or a conformal via in which the metal material is formed along an inner wall of the via hole.

The interconnect chip 220 may be disposed on the second surface S2 of the redistribution member 210, and may include a chip body 221, an interconnect circuit 222, and an interconnect pad 223. The interconnect chip 220 may have a size or a horizontal area, allowing a region of the chip body 221 to overlap the chip structures 30 in a vertical direction (a Z-direction), to connect the chip structures 30 to each other.

The chip body 221 may be formed based on ceramic, glass, a semiconductor, or the like. For example, the chip body 221 may be formed based on an active wafer, and may include silicon (Si), germanium (Ge), gallium-arsenide (GaAs), or the like. A passivation layer may be formed on one surface of the chip body 221 to protect the chip body 221 from external physical and chemical damages. The passivation layer may be formed of an oxide layer or a nitride layer, or may be formed of a double layer including an oxide layer and a nitride layer. For example, the passivation layer may be formed of a silicon oxide (SiO), a silicon nitride (SiN), or a combination thereof.

The interconnect circuit 222 may be formed in an interlayer insulating layer formed on one surface of the chip body 221. The interconnect circuit 222 may be electrically connected to the first pad structures 212P1 through the redistribution layer 212 and may electrically connect the chip structures 30 to each other. The interconnect circuit 222 may have a finer pitch than the redistribution layer 212. The interconnect pad 223 may be disposed on or in the interlayer insulating layer formed on one surface of the chip body 221, and may be in contact with the redistribution via 213.

The connection member 230 may include an insulating layer 231 and a via structure 235. The insulating layer 231 may surround the via structure 235 and may insulate the plurality of via structures 235 from each other. In some implementations, the via structure 235 may be surrounded by the encapsulant 240 and the insulating layer 231 may be omitted, such as in semiconductor package if of FIG. 7. The connection member 230 may have a through-hole 210H penetrating through the insulating layer 231 and accommodating the interconnect chip 220 therein. The through-hole 210H may have a shape continuously surrounding the interconnect chip 220 on a plane (an X-Y plane), but other implementations are possible. The connection member 230 may improve rigidity of a package and secure thickness uniformity of the encapsulant 240, depending on a material of the insulating layer 231.

The insulating layer 231 may include a thermosetting resin such as an epoxy resin, a thermoplastic resin such as a polyimide resin, a resin in which the thermosetting resin or the thermoplastic resin is mixed with an inorganic filler, for example, prepreg, ABF, FR-4, BT, a photoimageable dielectric (PID), or the like. The insulating layer 231 may include a plurality of layers, and boundaries between the respective layers may be distinct. However, the boundaries between the respective layers may not be distinct according to a process.

The via structure 235 may be disposed around the interconnect chip 220 and may be electrically connected to the redistribution layer 212. The via structure 235 may have a form in which a plurality of conductive elements, for example, wiring layers 232 and vias 233 are vertically stacked. For example, the first wiring layer 232*a* contacting the second surface S2 may be buried in the insulating layer 231 and may be coplanar with the interconnect chip 220. The second wiring layer 232*b*, opposing the first wiring layer 232*a*, may protrude from the insulating layer 231. In some implementations, the via structure 235 may be in the form of a post extending from the second surface S2 to the bump structures 250, such as in semiconductor package if of FIG. 7. The wiring layers 232 and the vias 233 may include copper (Cu), aluminum (Al), silver (Ag), tin (Sn), gold (Au), nickel (Ni), lead (Pb), titanium (Ti), or alloys thereof. The vias 233 may be field-type vias, filled with a metal material, or conformal-type vias in which a metal material is formed along a wall surface of a via hole.

The encapsulant 240 may encapsulate at least a portion of each of the interconnect chip 220 and the via structure 235 (or the connection member 230) below the second surface S2 of the redistribution member 210. The encapsulant 240 may include a thermosetting resin such as an epoxy resin, a thermoplastic resin such as a polyimide resin, a resin in which the thermosetting resin or the thermoplastic resin is mixed with an inorganic filler, for example, prepreg, ABF, FR-4, BT, an epoxy molding compound (EMC), or the like. According to the present disclosure, the thickness t2 of the encapsulant 240 covering the lower surface of the interconnect chip 220 and the thickness t1 covering the upper surface of the interconnect chip 220 may be at a similar level to reduce warpage of the substrate 20. In addition, bump structures 250 having a triple-layer structure may be formed on the lower surface 240S of the encapsulant 240. The bump structures 250 may be connected to the chip structures 30 through the via structures 235 and may be electrically connected to an external device such as a module substrate, a system board, or the like. A solder bump SB formed of, for example, tin (Sn), indium (In), bismuth (Bi), antimony (Sb), copper (Cu), silver (Ag), zinc (Zn), lead (Pb), or alloys thereof (for example, Sn—Ag—Cu) may be disposed below the bump structures 250. Hereinafter, the bump structures 250 will be described in detail with reference to FIG. 2.

Referring to FIG. 2 together, the bump structures 250 may include first bump structures 251, overlapping at least a portion of the interconnect chip 220 in a direction (a Z-direction), perpendicular to the second surface S2, and a second bump structure 252 overlapping at least a portion of the via structure 235 in the direction. The first bump structure 251 and the second bump structure 252 may include copper (Cu), aluminum (Al), silver (Ag), tin (Sn), gold (Au), nickel (Ni), and lead (Pb), titanium (Ti), or alloys thereof. The first bump structure 251 and the second bump structure 252 may have a three-layer structure including foil layers 251*a* and 252*a* contacting the encapsulant 240, seed layers 251*c* and 252*c*, and metal layers 251*d* and 252*d*, respectively. As an example, the foil layers 251*a* and 252*a*, the seed layers 251*c* and 252*c*, and the metal layers 251*d* and 252*d* may include the same material, for example, copper (Cu) or a copper (Cu) alloy.

The first bump structure 251 may be disposed in a location overlapping the interconnect chip 220, for example, in a fan-in region. The first bump structure 251 may include a first foil layer 251*a*, disposed on the encapsulant 240, and a first plating layer 251*b* disposed on the first foil layer 251*a*. The first plating layer 251*b* may include a first seed layer 251*c*, contacting the first foil layer 251*a*, and a first metal layer 251*d* contacting the first seed layer 251*c*. The first foil layer 251*a* may contact a lower surface 240S of the encapsulant 240. The first plating layer 251*b* may be spaced apart from the lower surface 240S of the encapsulant 240 by the first foil layer 251*a*. The first bump structure 251 may be a dummy bump insulated from the via structure 235, but other implementations are possible. In some implementations, the first bump structure 251 may be electrically connected to the via structure 235 through a wiring bypassing a region, not illustrated in the drawings.

The second bump structure 252 may be disposed at a location which does not overlap the interconnect chip 220, for example, in a fan-out region. The second bump structure 252 may include a second foil layer 252*a*, disposed on the encapsulant 240, and a second plating layer 252*b* disposed in an opening VH penetrating through the second foil layer 252*a* to expose at least a portion of the via structure 235. The second plating layer 252*b* may include a second seed layer 252*c*, contacting the second foil layer 252*a* and extending along the inside of the opening VH, and a second metal layer 252*d* contacting the second seed layer 252*c*. The second foil layer 252*a* may contact the lower surface 240S of the encapsulant 240. The second plating layer 252*b* may extend inwardly of the encapsulant 240 to contact the via structure 235. The second seed layer 252*c* may contact the second foil layer 252*a*, the encapsulant 240, and the via structure 235.

Returning to FIGS. 1A and 1B, the chip structures 30 may be disposed to be spaced apart from each other on the substrate 20 in the horizontal direction (the X-direction or the Y-direction). The chip structures 30 may be electrically connected to each other through the interconnect circuit 222. Each of the chip structures 30 may have at least a portion overlapping the interconnect chip 220 on the substrate 20 in the vertical direction (the Z-direction). For example, the chip structures may be disposed on the first surface S1 of the redistribution member 210 and may include a first chip structures 30A and a second chip structure 30B, respectively overlapping at least a portion of the interconnect chip 220.

Each of the first chip structure 30A and the second chip structure 30B may include a logic chip such as a central processor (CPU), a graphics processor (GPU), a field programmable gate array (FPGA), an application processor (AP), a digital signal processor, a cryptographic processor, a microprocessor, a microcontroller, an analog-to-digital converter, an application-specific integrated circuit (ASIC), an application processor (AP), or the like, and a memory chip including a volatile memory such as a dynamic random access memory (DRAM), a static RAM (SRAM), or the like, and a nonvolatile memory such as a phase change RAM (PRAM), a magnetic RAM (MRAM), a resistive RAM (RRAM), a flash memory, or the like.

In some implementations, the first chip structure 30A and the second chip structure 30B may include different types of semiconductor chip. For example, the first chip structure 30A may include a logic chip such as a CPU, a GPU, or an ASIC, and the second chip structure 30B may include a memory chip such as a DRAM or a flash memory.

Figure 3:
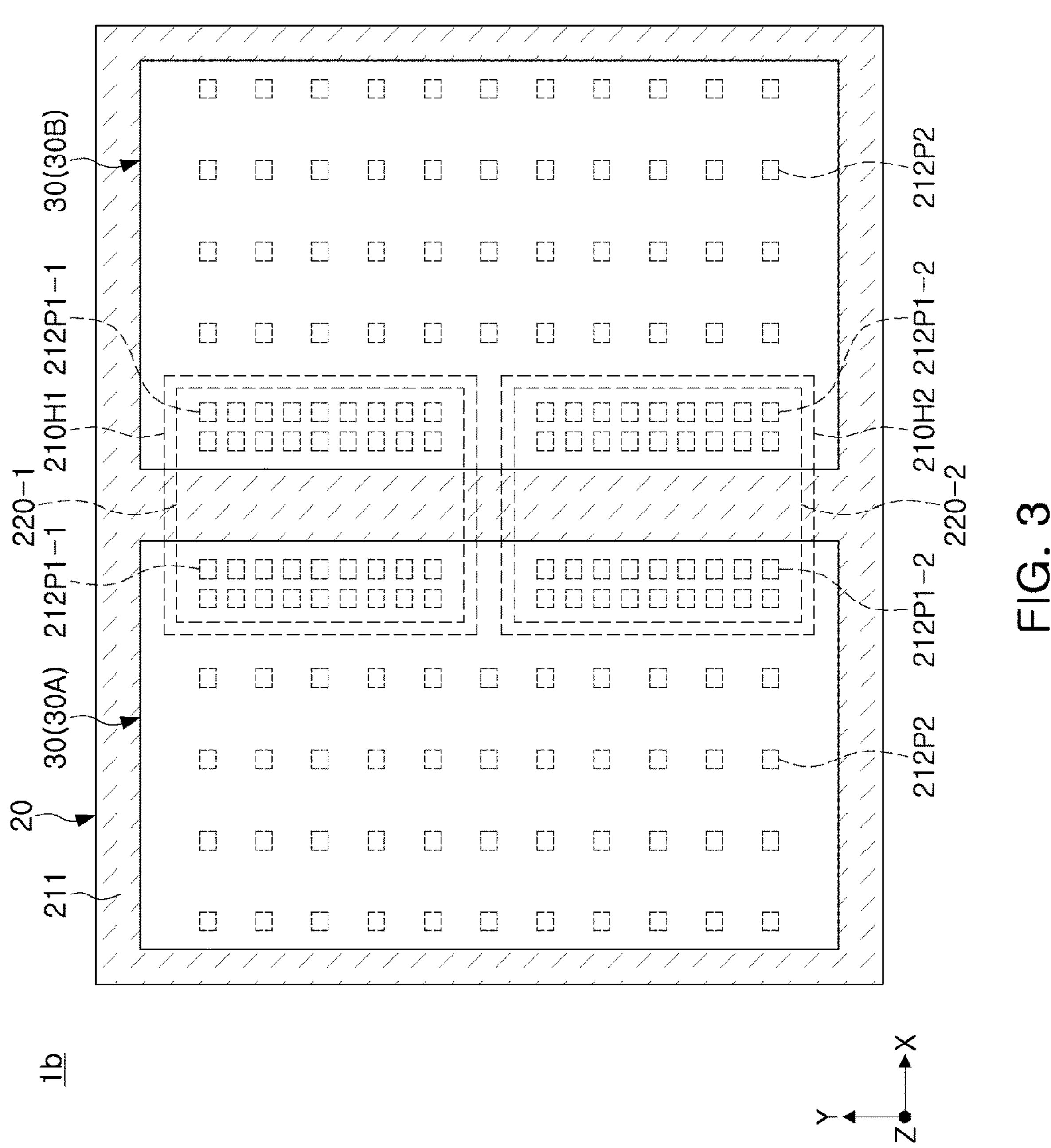
FIG. 3 is a plan view of an example of a semiconductor package.

FIG. 3 is a plan view of an example of a semiconductor package 1*b*.

Referring to FIG. 3, the semiconductor package 1*b* may have features the same as or similar to those described with reference to FIGS. 1A to 2, except that the semiconductor package 1*b* includes a plurality of interconnect chips 220-1 and 220-2.

The semiconductor package 1*b* includes a plurality of interconnect chips 220-1 and 220-2, respectively overlapping a first chip structure 30A and a second chip structure 30B, and the substrate 20 may have a plurality of through-holes 210H1 and 210H2, respectively accommodating a plurality of interconnect chips 220-1 and 220-2 therein. Shapes, relative sizes, and arrangement of the first chip structure 30A, the second chip structure 30B, and the plurality of interconnect chips 220-1 and 220-2 may vary depending on designs thereof.

For example, the substrate 20 may include a first interconnect chip 220-1, disposed in a first through-hole 210H1, and a second interconnect chip 220-2 disposed in a second through-hole 210H2. The first chip structure 30A and the second chip structure 30B may be mounted on the substrate 20 to vertically overlap the first interconnect chip 220-1 and the second interconnect chip 220-2, respectively. The first chip structure 30A and the second chip structure 30B may be electrically connected to each other through the first interconnect chip 220-1 and the second interconnect chip 220-2.

Figure 4A:
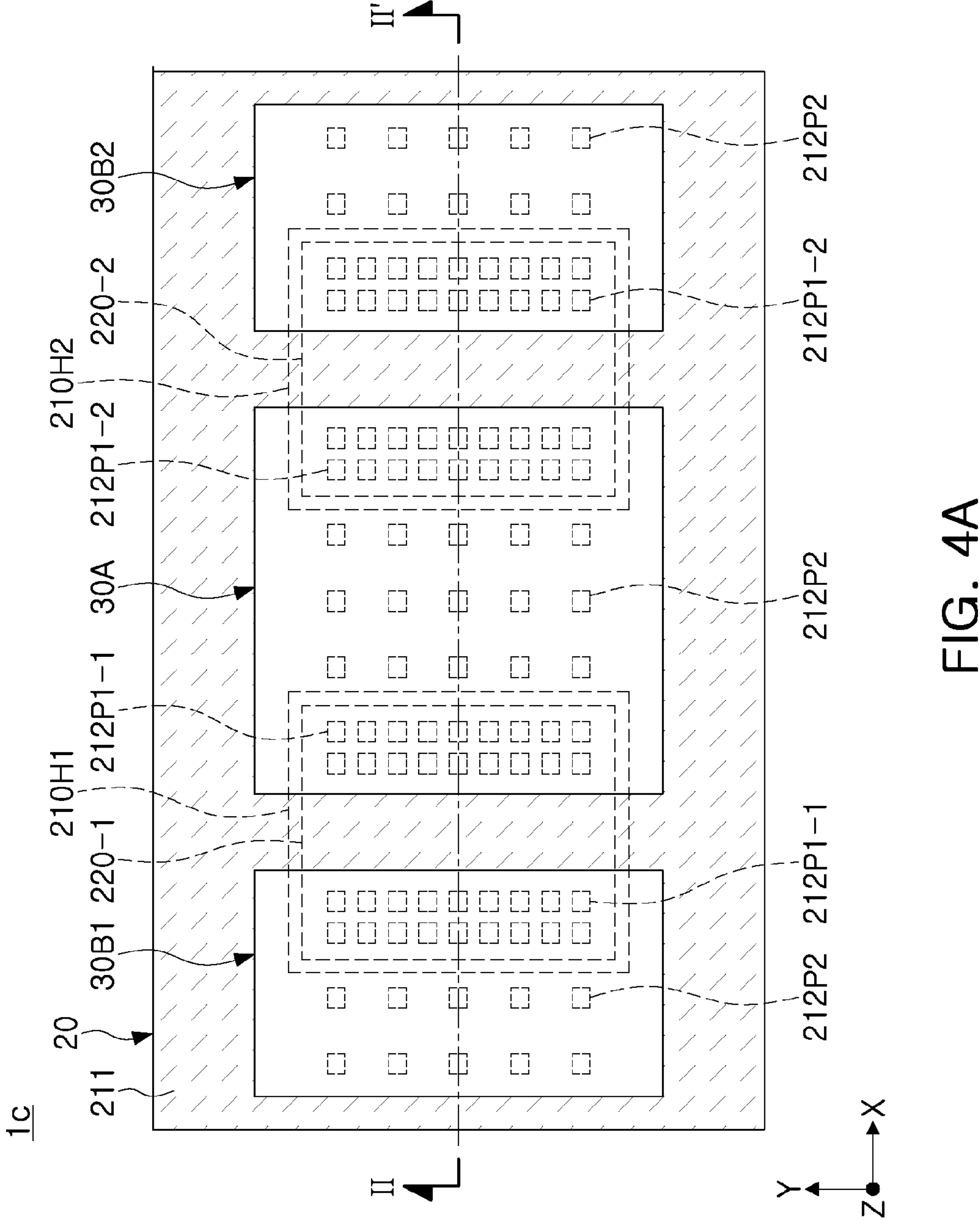
FIG. 4A is a plan view of an example of a semiconductor package.
Figure 4B:
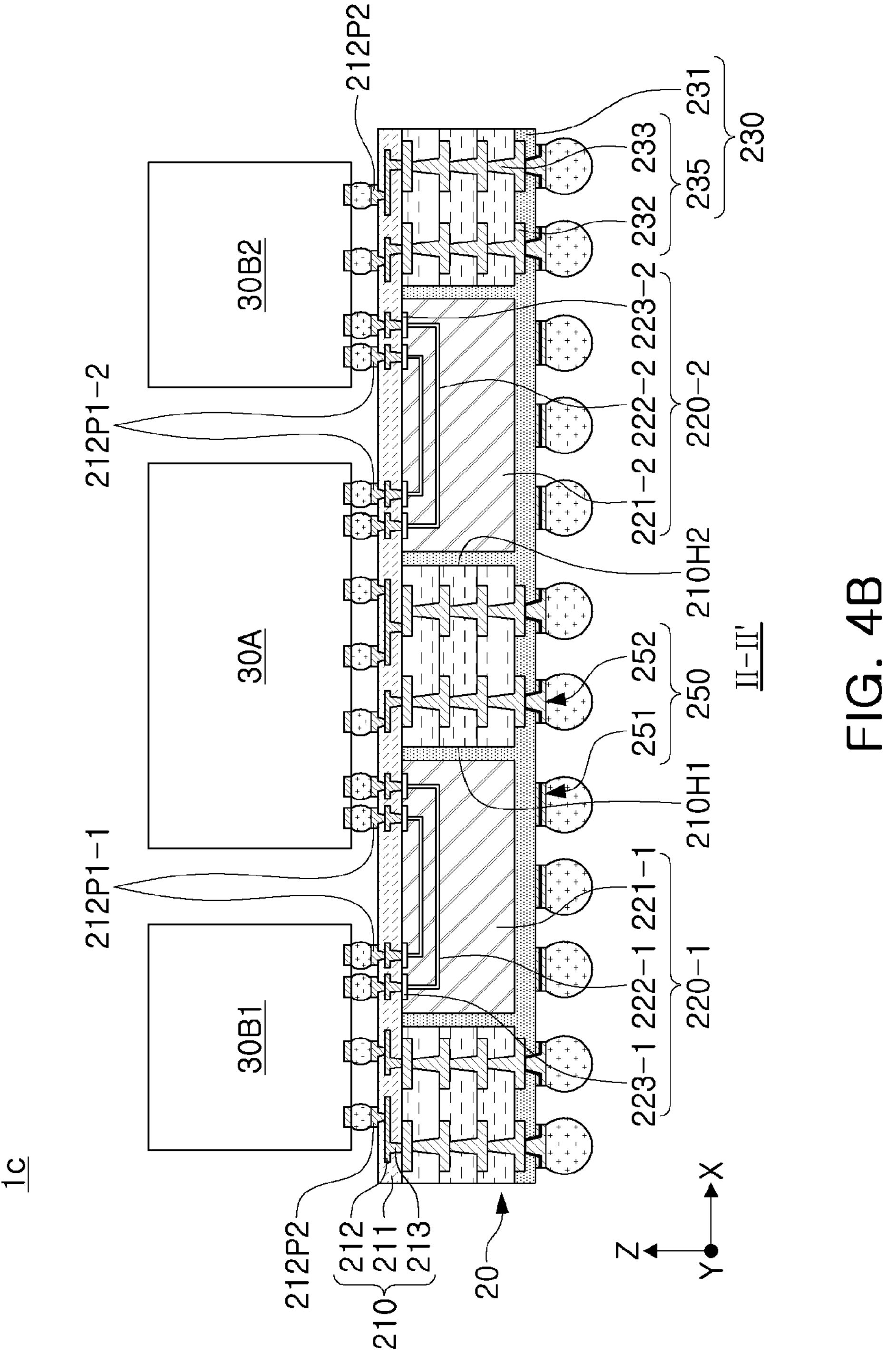
FIG. 4B is a cross-sectional view taken along line II-IT of FIG. 4A.

FIG. 4A is a plan view of an example of a semiconductor package 1*c*, and FIG. 4B is a cross-sectional view taken along line II-IT of FIG. 4A.

Referring to FIGS. 4A and 4B, the semiconductor package 1*c* may have features the same as or similar to those described with reference to FIGS. 1 to 3, except that the semiconductor package 1*c* includes a plurality of second chip structures 30B1 and 30B2 disposed around a first chip structure 30A.

The semiconductor package 1*c* may include a plurality of second chip structures 30B1 and 30B2 disposed around the first chip structure 30A, and the substrate 20 may include a plurality of interconnect chips 220-1 and 220-2*a* electrically connecting each of the plurality of second chip structures 30B1 and 30B2 to the first chip structure 30A. The substrate 20 may have a plurality of through-holes 210H1 and 210H2, respectively accommodating the plurality of interconnect chips 220-1 and 220-2 therein.

For example, the substrate 20 may include a first interconnect chip 220-1, disposed in the first through-hole 210H1, and a second interconnect chip 220-2 disposed in the second through-hole 210H2. A first chip structure 30A and a 2-1-th chip structure 30B1 and a 2-2-th chip structure 30B2 may be mounted on the substrate 20 to overlap the first interconnect chip 220-1 and the second interconnect chip 220-2, respectively.

The plurality of second chip structures 30B1 and 30B2 may be spaced apart from each other in a horizontal direction (for example, an X-direction). The first chip structure 30A may be disposed between the plurality of second chip structures 30B1 and 30B2 spaced apart from each other, but a dispositional relationship between the first chip structure 30A and the plurality of second chip structures 30B1 and 30B2 is not limited thereto. In plan view, the plurality of second chip structures 30B1 and 30B2 may be disposed to be adjacent to left and right surfaces of the first chip structure 30A, as well as upper and lower surfaces of the first chip structure 30A. The first chip structure 30A and the plurality of second chip structures 30B1 and 30B2 may be provided in greater numbers than those illustrated in the drawings and accordingly, and the number of interconnect chips may be increased correspondingly.

Figure 5:
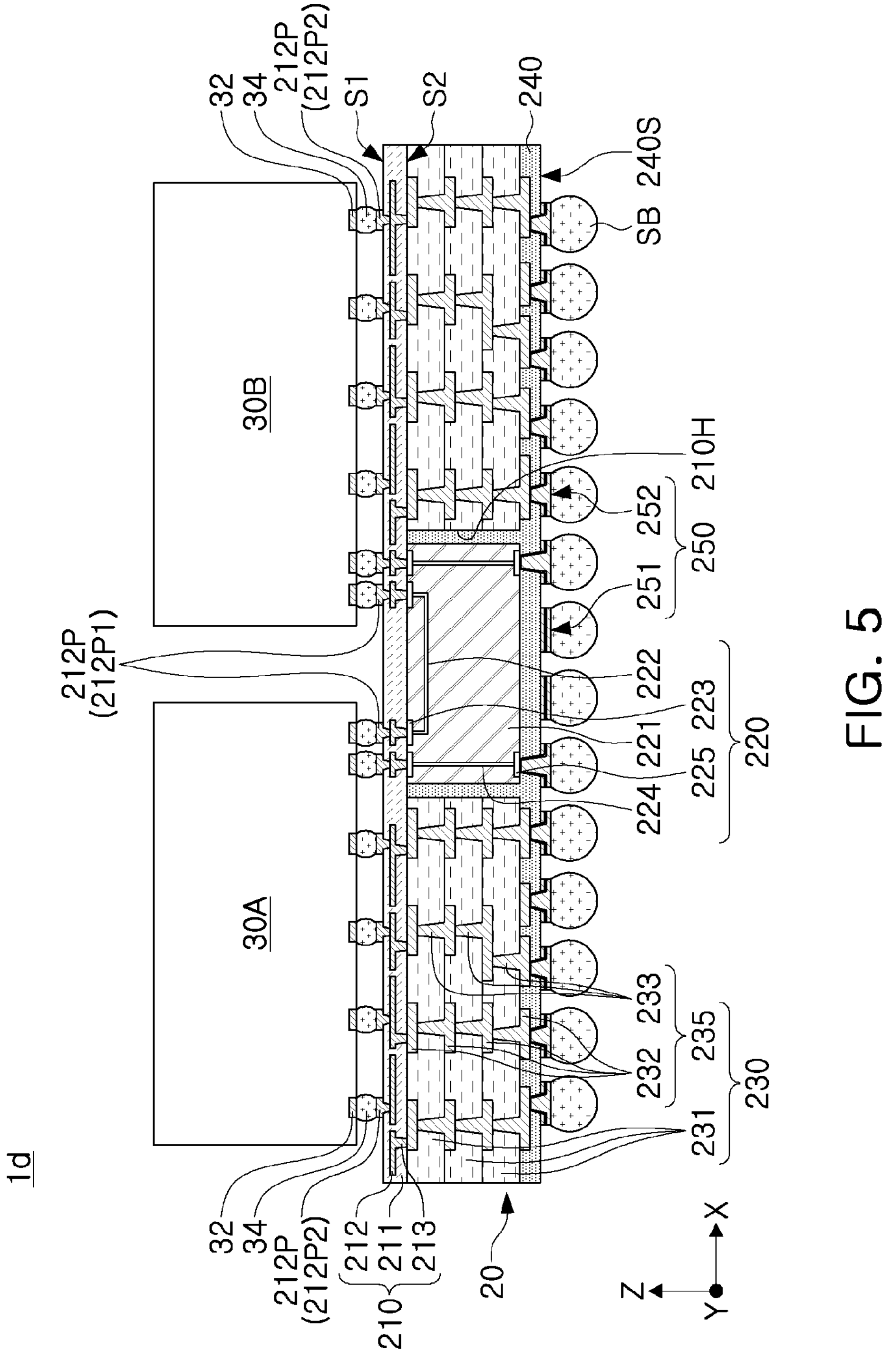
FIG. 5 is a cross-sectional view of an example of a semiconductor package.

FIG. 5 is a cross-sectional view of an example of a semiconductor package 1*d*.

Referring to FIG. 5, the semiconductor package 1*d* may have features the same as or similar to those described with reference to FIGS. 1A to 4, except that the semiconductor package 1*d* includes a through-via 224 penetrating through an interconnect chip 220.

In semiconductor package 1*d*, the interconnect chip 220 may include a through-via 224 and a backside pad 225. The through-via 224 may electrically connect an interconnect pad 223 to the backside pad 225. The through-via 224 may be a through-silicon via (TSV) penetrating through the chip body 221. In some implementations, an interconnect circuit 222 or first and second chip structures 30A and 30B may be electrically connected to the bump structure 250 through the through-via 224.

Figure 6:
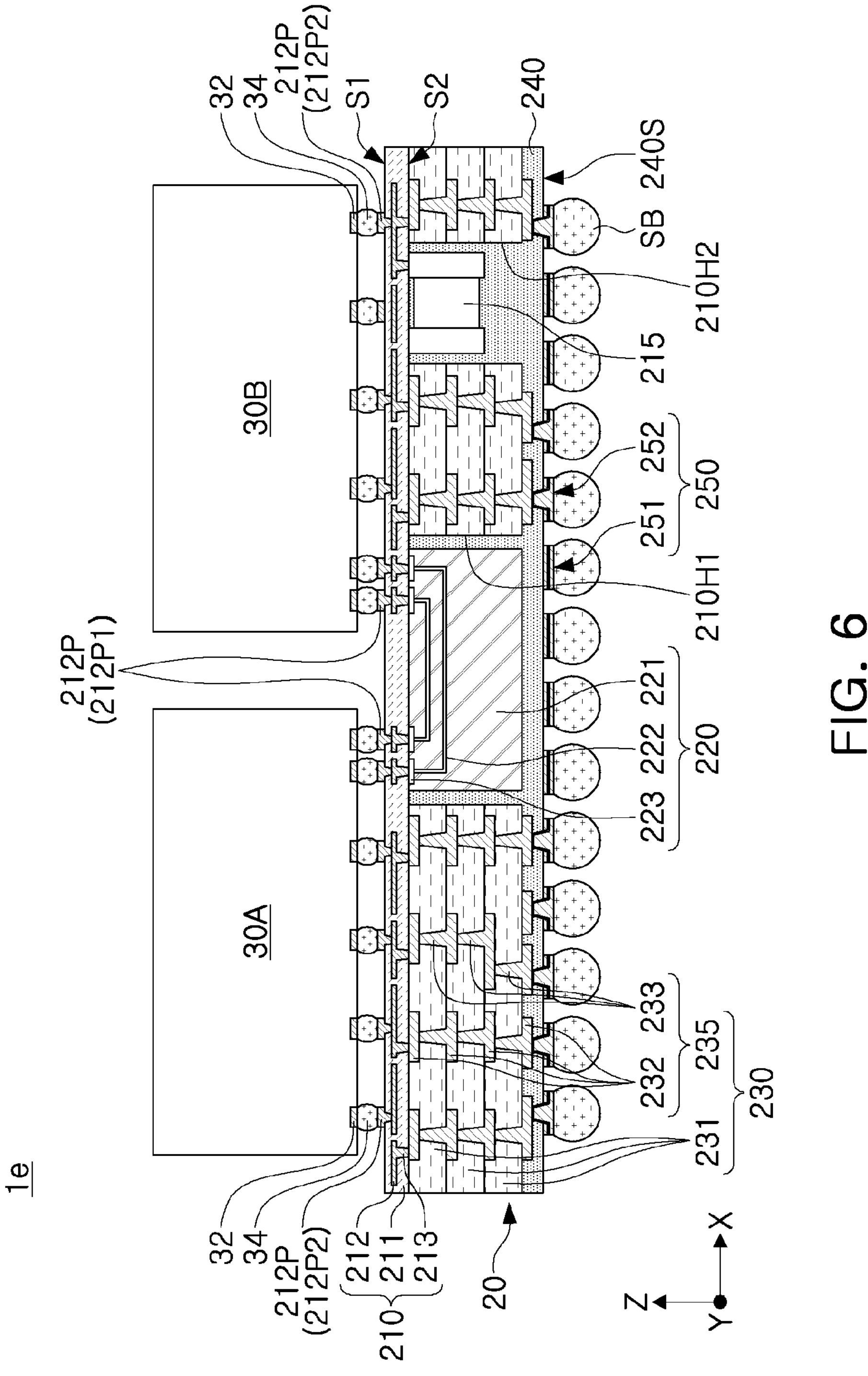
FIG. 6 is a cross-sectional view of an example of a semiconductor package.

FIG. 6 is a cross-sectional view of an example of a semiconductor package 1*e*.

Referring to FIG. 6, the semiconductor package 1*e* may have features the same as or similar to those described with reference to FIGS. 1A to 5, except that the semiconductor package 1*e* further includes a passive component 215 embedded in the substrate 20.

In the semiconductor package 1*e*, a substrate 20 may include at least one passive component 215 disposed on a second surface S2 of a redistribution member 210 and electrically connected to a redistribution layer 212. The passive component 215 may be electrically connected to a first chip structure 30A and a second chip structure 30B through the redistribution layer 212. As an example, a connection member 230 may have a second through-hole 210H2 accommodating the passive component 215 therein. The second through-hole 210H2 may be spaced apart from a first through-hole 210H1 accommodating an interconnect chip 220 therein. The passive component 215 may include a capacitor such as a multilayer ceramic capacitor (MLCC) or a low inductance chip capacitor (LICC), an inductor such as a chip inductor or a power inductor, beads, or the like. The number of passive components 215 is not limited, and the passive components 215 may be provided in greater numbers than those illustrated in the drawing.

Figure 7:
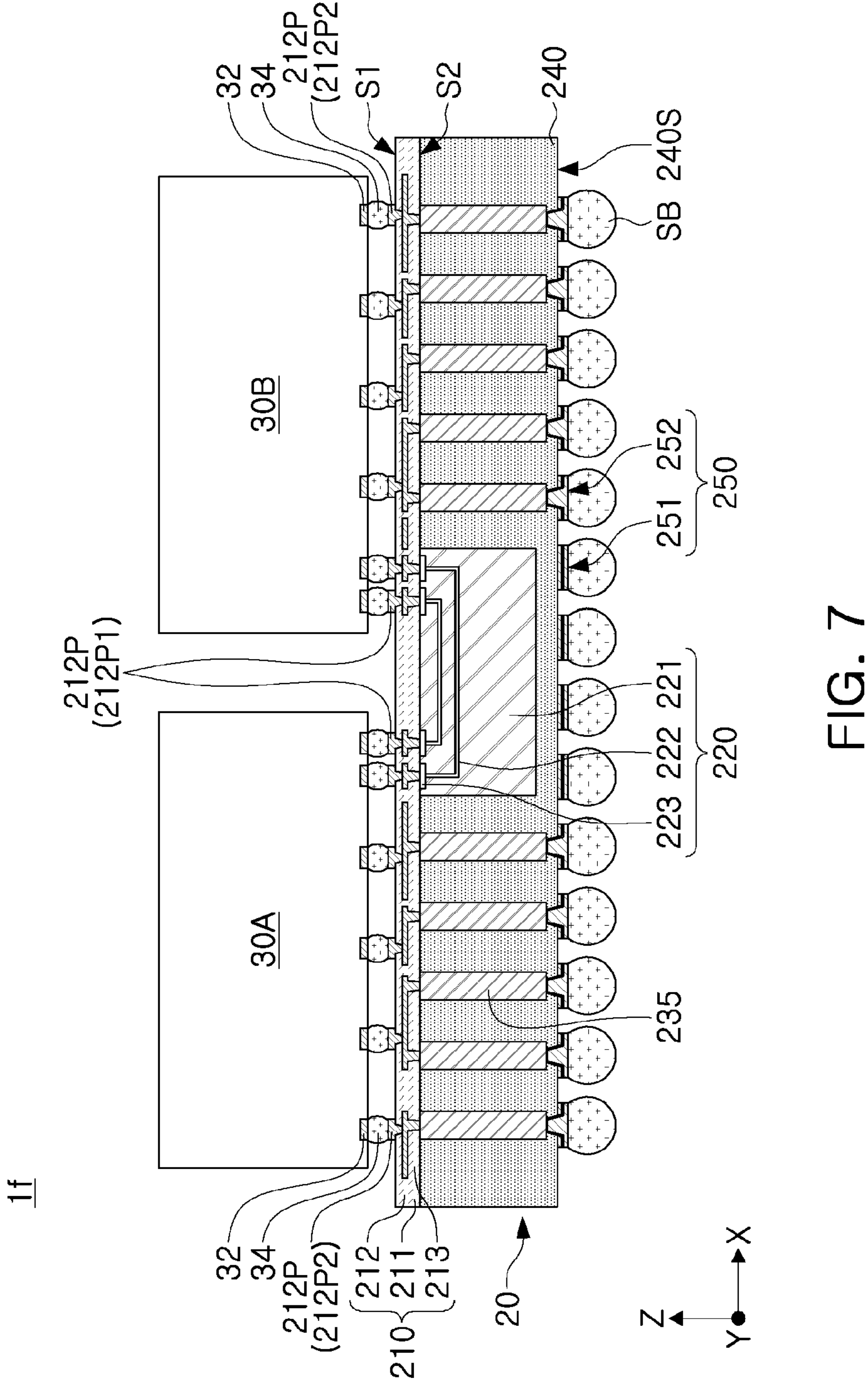
FIG. 7 is a cross-sectional view of an example of a semiconductor package.

FIG. 7 is a cross-sectional view of an example of a semiconductor package 1*f*.

Referring to FIG. 7, the semiconductor package if may have features the same as or similar to those described with reference to FIGS. 1A to 6, except that the semiconductor package if includes via structures 235 directly penetrating through the encapsulant 240.

In the semiconductor package 1*f*, the via structure 235 may have a shape of a post penetrating through the encapsulant 240, rather than the form in which a plurality of conductive elements are stacked (see FIG. 1B). In this case, the bump structure 250 may be formed on a planar surface formed by grinding one surface of the encapsulant 240. The via structure 235 may include a metal material including copper (Cu), aluminum (Al), silver (Ag), tin (Sn), gold (Au), nickel (Ni), lead (Pb), titanium (Ti), or alloys thereof. A seed layer, not illustrated, may be formed above or below the via structure 235. A thickness of the encapsulant 240, covering a lower end of the via structure 235, may be similar to a thickness of a dielectric layer 211 of a redistribution member 210.

Figure 8:
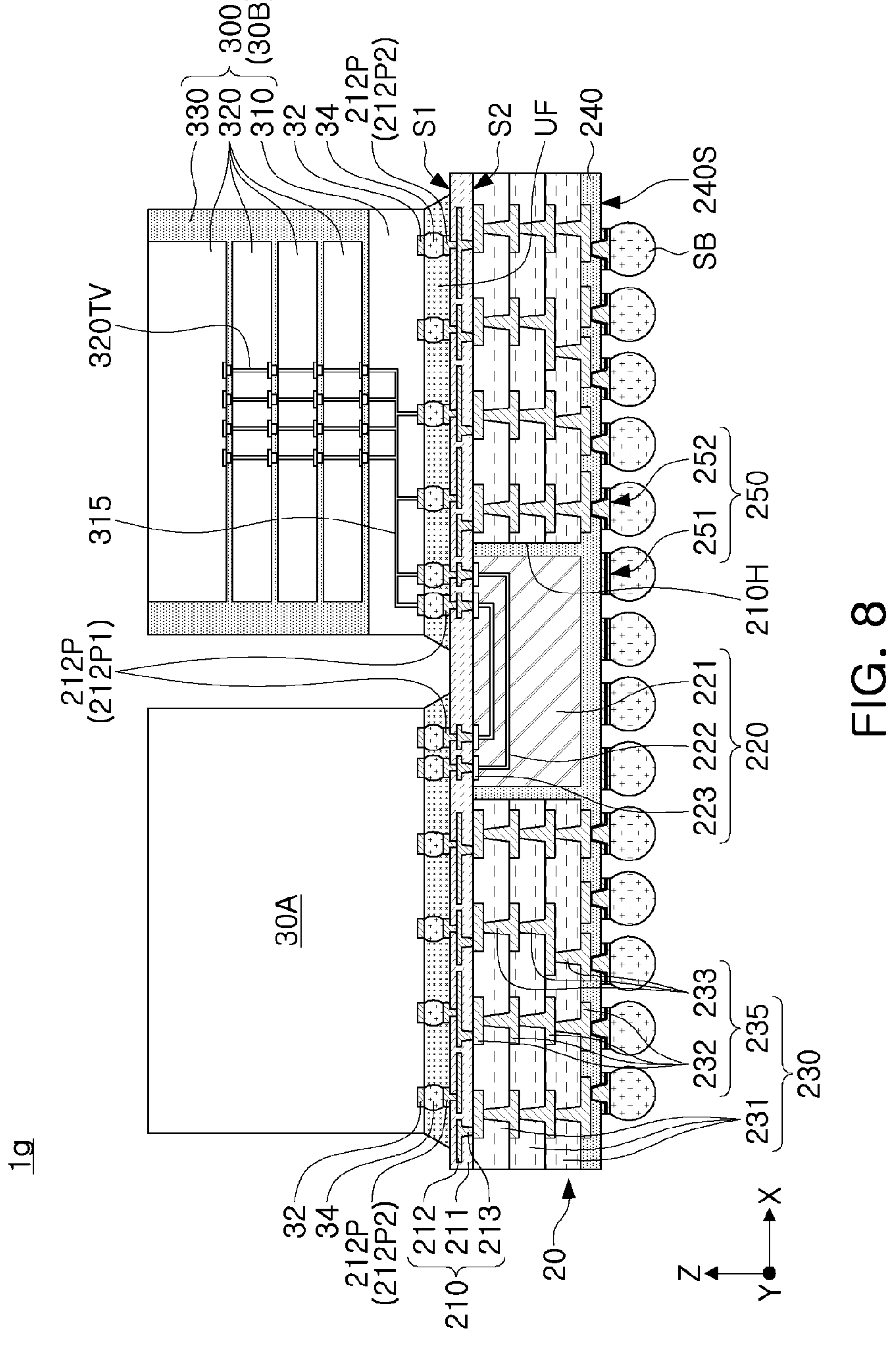
FIG. 8 is a cross-sectional view of an example of a semiconductor package.

FIG. 8 is a cross-sectional view of an example of a semiconductor package 1*g*.

Referring to FIG. 8, the semiconductor package 1*g* may have features the same as or similar to those described with reference to FIGS. 1A to 7, except that a second chip structure 30B is provided as a high-capacity memory device 300. In some implementations, an underfill layer UF may be formed below a first chip structure 30A and the second chip structure 30B. The underfill layer UF may be in the form of a capillary underfill (CUF) or a molded underfill (MUF).

In the semiconductor package 1*g*, the first chip structure 30A may be a logic chip including an ASIC, and the second chip structure 30B may be a high-capacity memory device 300 including a plurality of memory chips 320, for example, a high bandwidth memory (HBM) or an electro data processing (EDP) device. For example, the memory device 300 may include a base chip 310, a memory chip 320, and a molding layer 330.

The base chip 310 may be a buffer chip or a control chip including a plurality of logic devices and/or memory devices. The base chip 310 may transmit signals from the memory chips 320 to an external entity, and may also transmit external signals and power to the memory chips 320.

The memory chips 320 may be memory chips including volatile memory devices such as a dynamic random access memory (DRAM) and a static random access memory (SRAM), or a nonvolatile memory devices such as a phase-change random access memory (PRAM), a magnetoresistive random access memory (MRAM), a ferroelectric random access memory (FeRAM), a resistive random access memory (RRAM), and a flash memory. The memory chips 320 may be electrically connected to each other through a through-electrode 320TV. However, an uppermost memory chip 320 may not include the through-electrode 320TV and may have a relatively high thickness.

The molding layer 330 may be disposed on the base chip 310 and may encapsulate at least a portion of each of the memory chips 320. The molding layer 33 may be formed to expose an upper surface of the memory chip 320 disposed on an uppermost portion. The molding layer 330 may be formed using, for example, an EMC, but a material of the molding layer 33 is not limited thereto.

Figure 9:
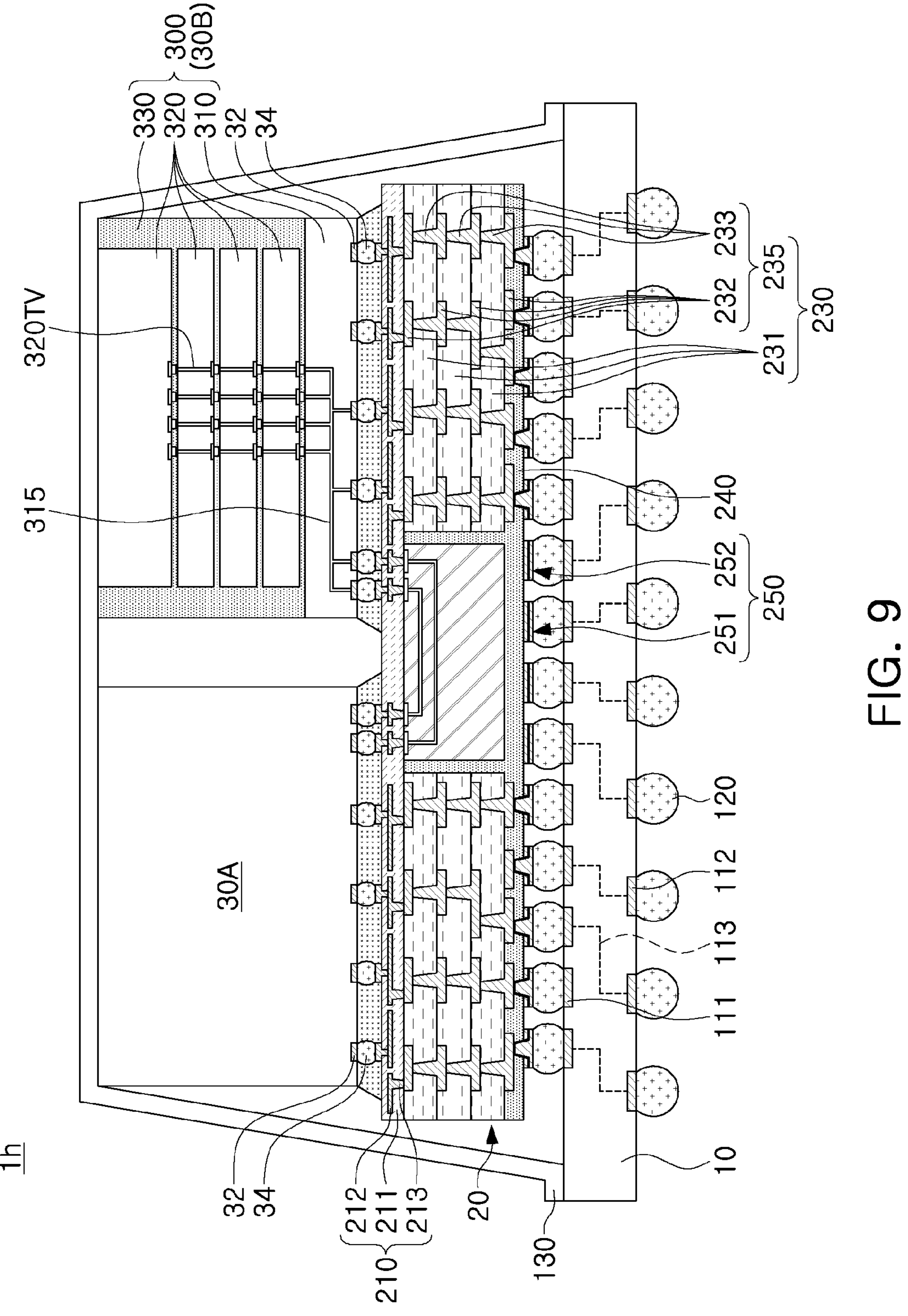
FIG. 9 is a cross-sectional view of an example of a semiconductor package.

FIG. 9 is a cross-sectional view of an example of a semiconductor package 1*h*.

Referring to FIG. 9, the semiconductor package 1*h* may have features the same as or similar to those described with reference to FIGS. 1A to 8, except that the semiconductor package 1*h* further includes a base substrate 10 and a heat dissipation structure 130.

The semiconductor package 1*h* may include a base substrate 10, a substrate 20 (or an interposer substrate), and chip structures 30A and 30B.

The base substrate 10 may be a support substrate on which the substrate 20, e.g., an interposer substrate, is mounted, and may be a substrate for a semiconductor package such as a printed circuit board (PCB), a ceramic substrate, or a tape wiring board. The base substrate 10 may include a lower pad 112 disposed on a lower surface thereof, an upper pad 111 disposed on the upper surface thereof, and a wiring circuit 113 electrically connecting the lower pad 112 and the upper pad 111 to each other. A body of the base substrate 10 may include different materials depending on the type of the substrate. For example, when the base substrate 10 is a PCB, the PCB may have a form in which a wiring layer is additionally laminated on one surface or both surfaces of a body copper clad laminate or a copper clad laminate. An external connection bump 120, connected to the lower pad 112, may be disposed on the lower surface of the base substrate 10. The external connection bump 120 may include tin (Sn), indium (In), bismuth (Bi), antimony (Sb), copper (Cu), silver (Ag), zinc (Zn), lead (Pb) and/or alloys thereof.

The heat dissipation structure 130 may be disposed on the upper surface of the base substrate 10 and may be formed to cover upper portions of the chip structures 30A and 30B. The heat dissipation structure 130 may be attached to the base substrate 10 by an adhesive. The adhesive may be a thermally conductive adhesive tape, a thermally conductive grease, a thermally conductive adhesive, or the like. A thermal interface material layer, not illustrated, may be disposed between the heat dissipation structure 130 and the chip structures 30A and 30B. The heat dissipation structure 130 may be formed of a material having improved thermal conductivity, for example, metal or a metal alloy including gold (Au), silver (Ag), copper (Cu), iron (Fe), or the like, or graphite, graphite, or the like. The heat dissipation structure 130 may have a shape, different from that illustrated in the drawing. For example, the heat dissipation structure 130 may have a plate shape covering only upper surfaces of the chip structures 30A and 30B.

FIGS. 10A to 10I are cross-sectional views illustrating a method of manufacturing the semiconductor package 1*a* of FIG. 1B.

Figures 10A, 10B:
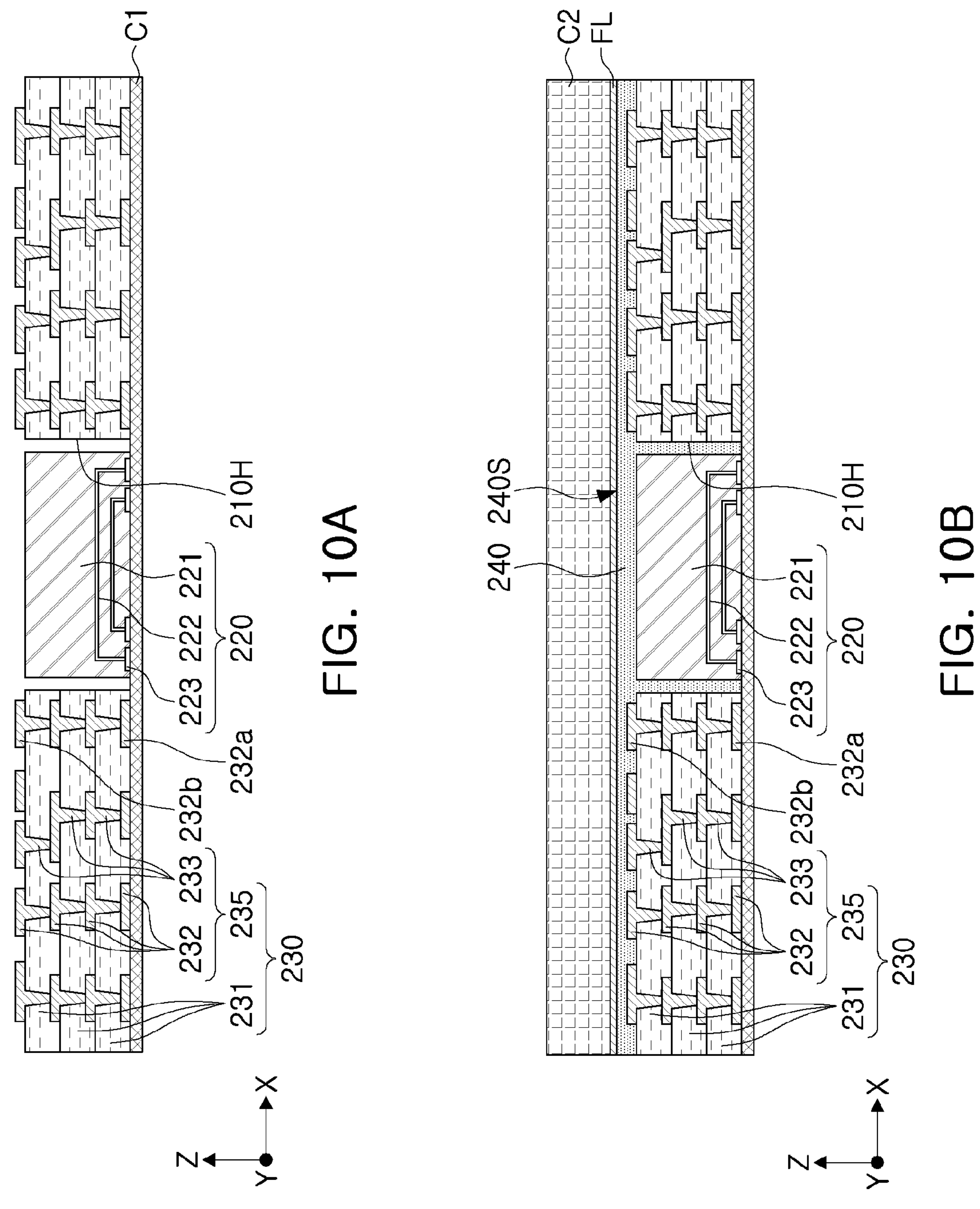
FIGS. 10A to 10I are cross-sectional views illustrating a method of manufacturing the semiconductor package of FIG. 1B.

Referring to FIG. 10A, a connection member 230 provided with a via structure 235 or a through-hole 210H may be attached to a first carrier C1. The first carrier C1 may include, for example, an adhesive tape of which adhesiveness is lost by irradiation of ultraviolet (UV). The via structure 235 may have a form in which wiring layers 232 and vias 233 are stacked, as illustrated in the drawing. In some implementations, the via structure 235 may be in the form of a post extending vertically, such as in semiconductor package if of FIG. 7. The through-hole 210H may be formed by physically or chemically removing a portion of the insulating layer 231 of the connection member 230. For example, the through-hole 210H may be formed using laser drilling. The connection member 230 may be disposed such that the first wiring layer 232*a* buried in the insulating layer 231 is downwardly directed.

Then, an interconnect chip 220 may be attached to the first carrier C1. The interconnect chip 220 may be disposed in a region surrounded by the via structures 235, for example, in the through-hole 210H of the connection member 230. The interconnect chip 220 may be disposed such that the interconnect pad 223 is downwardly directed.

Referring to FIG. 10B, an encapsulant 240 may be formed using the second carrier C2 to which a preliminary foil layer FL is attached. The second carrier C2 may include, for example, a copper clad laminate (CCL). The preliminary foil layer FL may be a metal layer including copper (Cu) or a copper (Cu) alloy. A release layer for delamination of the second carrier C2 may be interposed between the second carrier C2 and the preliminary foil layer FL. The encapsulant 240 may be formed to encapsulate each of the interconnect chip 220 and the via structure 235. As an example, the encapsulant 240 may be formed using an insulating film (hereinafter, referred to as a "preliminary encapsulant") laminated on the preliminary foil layer FL. The preliminary encapsulant may include an insulating resin such as ABF.

Figure 10C:
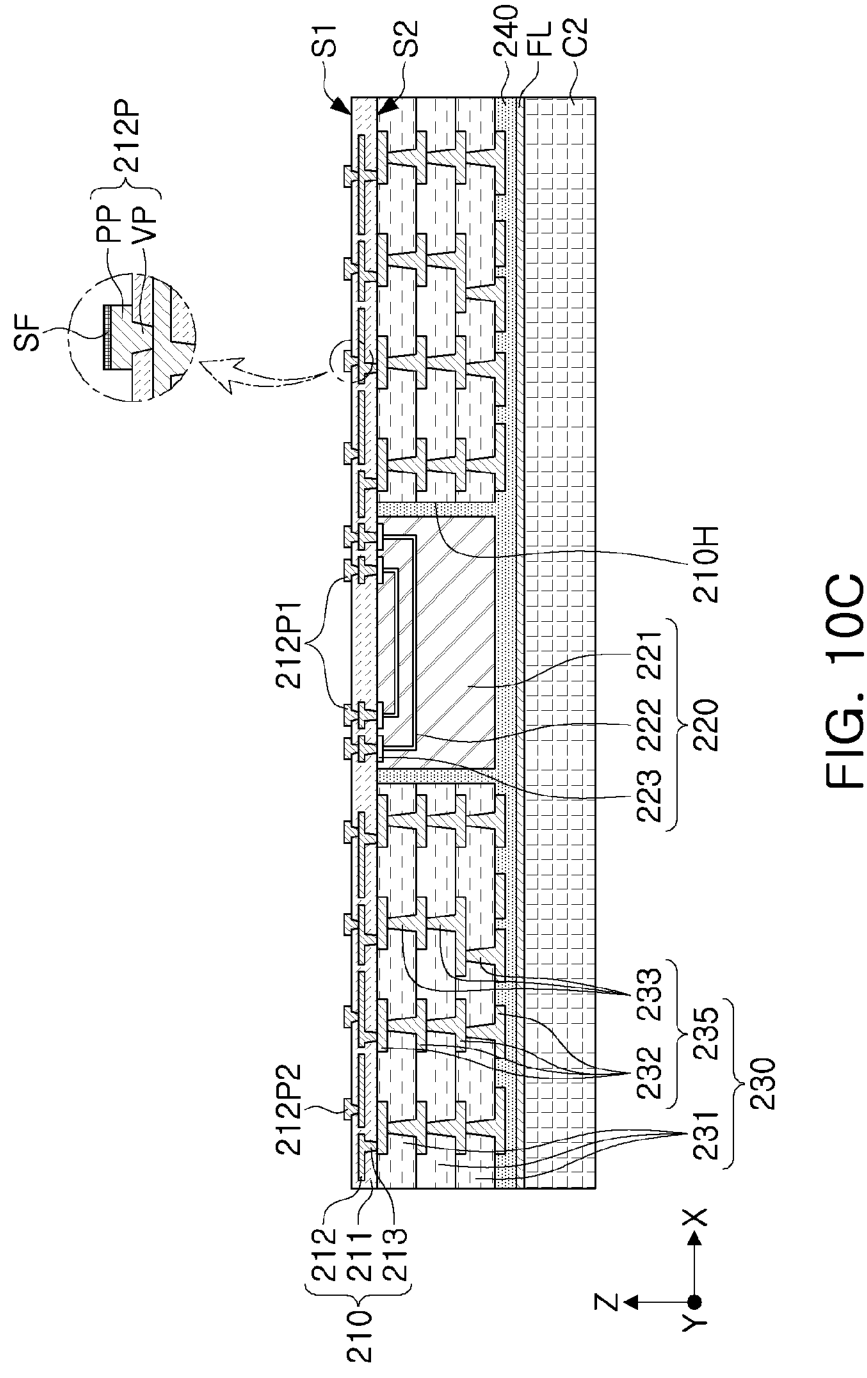

Referring to FIG. 10C, a redistribution member 210 may be formed on the interconnect chip 220 and the via structure 235. The redistribution member 210 may be formed on the interconnect chip 220 and the via structure 235 exposed by removing the first carrier. The redistribution member 210 may include a dielectric layer 211, a redistribution layer 212, a redistribution via 213, and first and second pad structures 212P1 and 212P2. The dielectric layer 211 may be formed by applying a photosensitive resin such as PID to the interconnect chip 220 and the via structure 235 and curing the applied photosensitive resin. The redistribution layer 212, the redistribution via 213, and the first and second pad structures 212P1 and 212P2 may be formed using a photolithography process, a plating process, or the like. The first and second pad structures 212P1 and 212P2 may include a pad portion PP, disposed on a first surface S1, and a via portion VP extending inwardly of the dielectric layer 211 to connect the pad portion PP to the redistribution layer 212. A surface layer SF, including nickel (Ni), gold (Au), or alloys thereof, may be formed on the pad portion PP. The first pad structures 212P1 and the second pad structures 212P2 may be formed to have substantially the same size. The first pad structures 212P1 may be formed to have a finer pitch than that of the second pad structures 212P2.

Figure 10D:
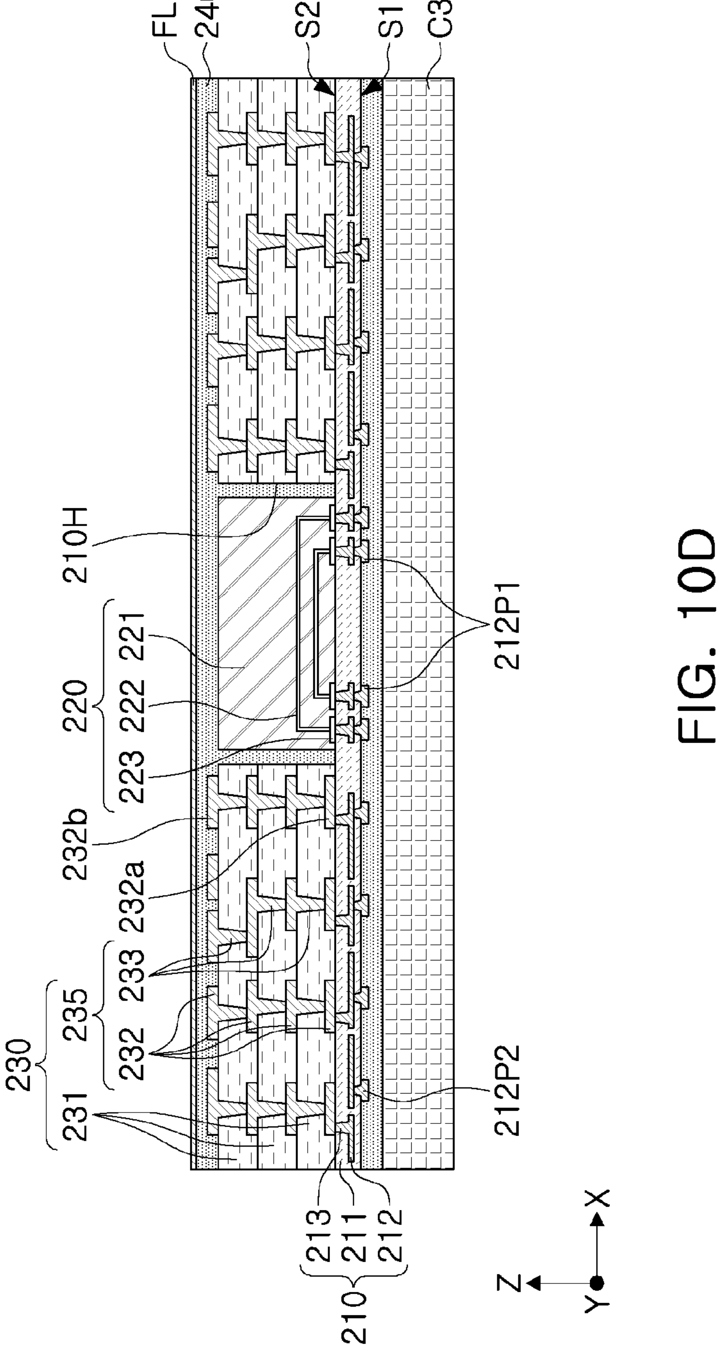

Referring to FIG. 10D, the second carrier C2 may be removed and a preliminary foil layer FL may be formed on the encapsulant 240. A third carrier C3 may be attached to the redistribution member 210 to support and fix the interconnect chip 220, the connection member 230, and the like, in a subsequent process. The preliminary foil layer FL may be transferred from the second carrier C2 to be attached to the encapsulant 240 after the removal of the second carrier C2.

Figure 10E:
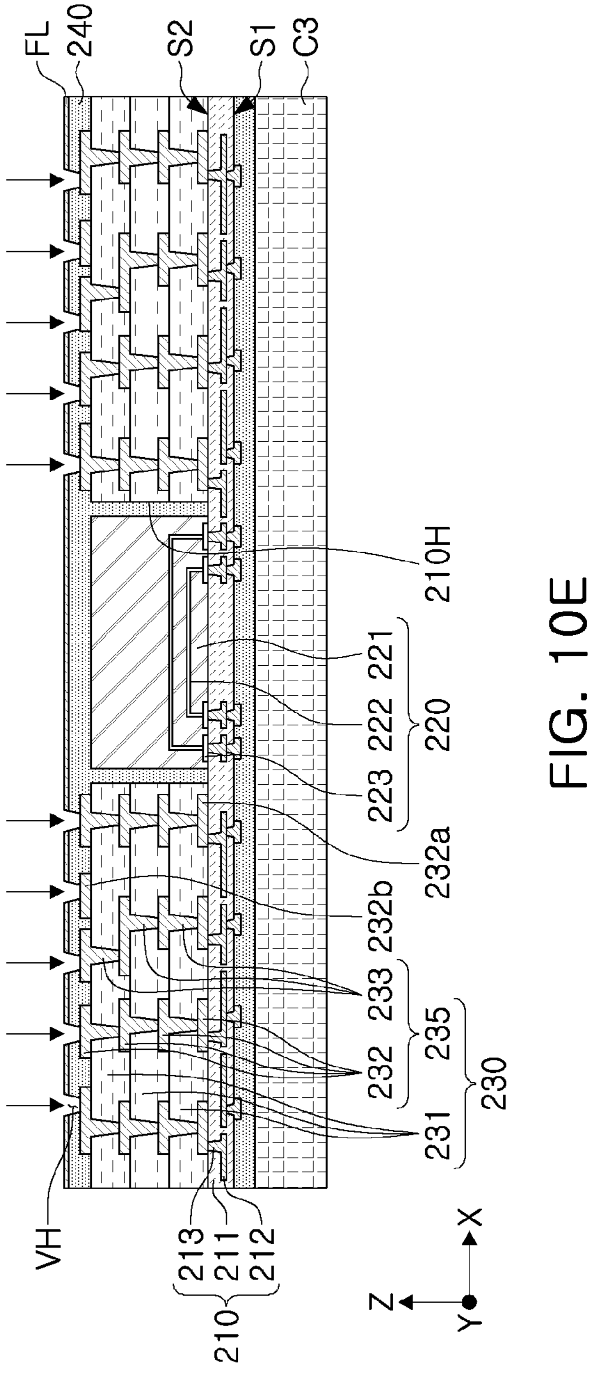

Referring to FIG. 10E, an opening (or a "via hole") VH may be formed to expose at least a portion of the via structure 235 through the preliminary foil layer FL. The opening VH may be formed by removing a portion of the preliminary foil layer FL and the encapsulant 240 using laser drilling, or the like. The opening VH may have an internal wall tapered, but other implementations are possible. Also, the opening VH may be formed to expose a portion of the via structure 235, for example, at least a portion of the second wiring layer 232*b*.

Figure 10F:
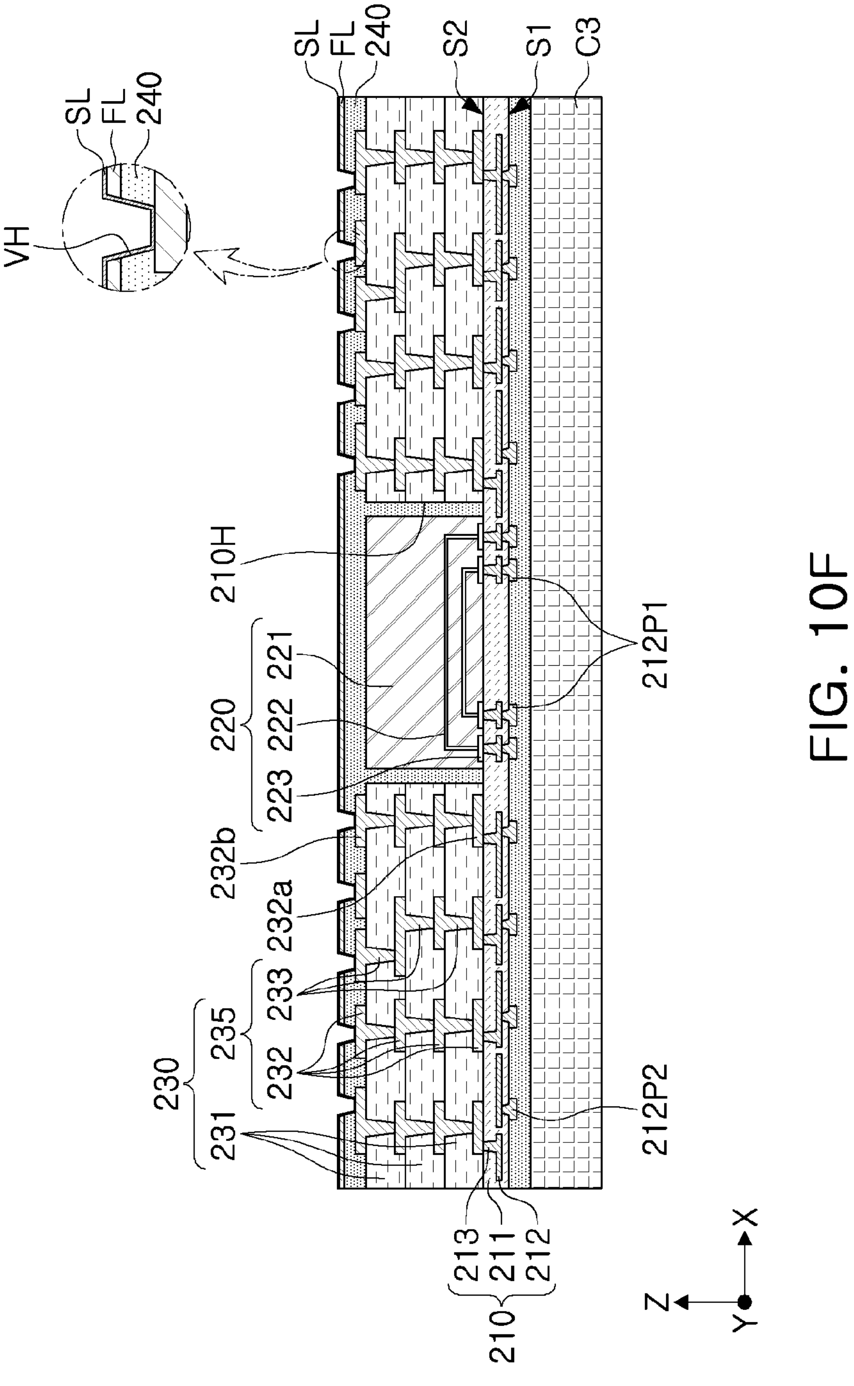

Referring to FIG. 10F, a preliminary seed layer SL may be formed to extend along a surface of the preliminary foil layer FL and an inside of the opening VH. The preliminary seed layer SL may be conformally formed along an upper surface of the preliminary foil layer FL, an internal wall surface of the opening VH, and an upper surface of the via structure 235 exposed through the opening VH. The preliminary foil layer FL may improve tackiness and adhesion between the encapsulant 240 and the preliminary seed layer SL. The preliminary seed layer SL may include the same material as the preliminary foil layer FL, for example, copper (Cu) or a copper (Cu) alloy. The preliminary seed layer SL may be formed using, for example, an electroless plating process, but other implementations are possible.

Figure 10G:
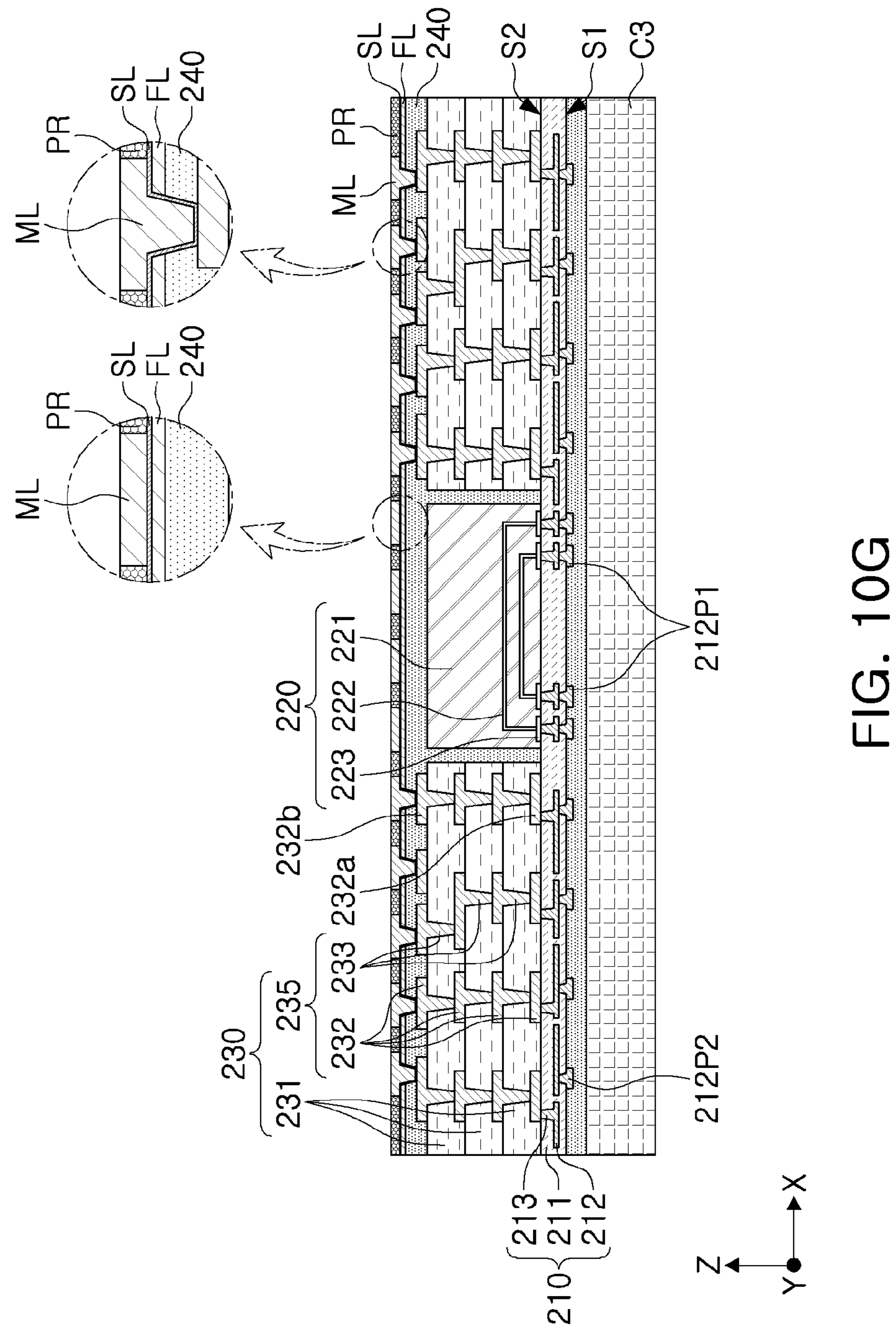

Referring to FIG. 10G, a metal layer ML may be formed on the preliminary seed layer SL using a patterned photosensitive material layer PR. The photosensitive material layer PR may be patterned by an exposure process, a developing process, or the like. The metal layer ML may be formed by an electroplating process using a preliminary seed layer SL. The metal layer ML may include, for example, copper (Cu) or an alloy of copper (Cu). The photosensitive material layer PR may be removed, and an etching process may then be performed to pattern a preliminary seed layer 154S' and a preliminary barrier layer 155'.

Figure 10H:
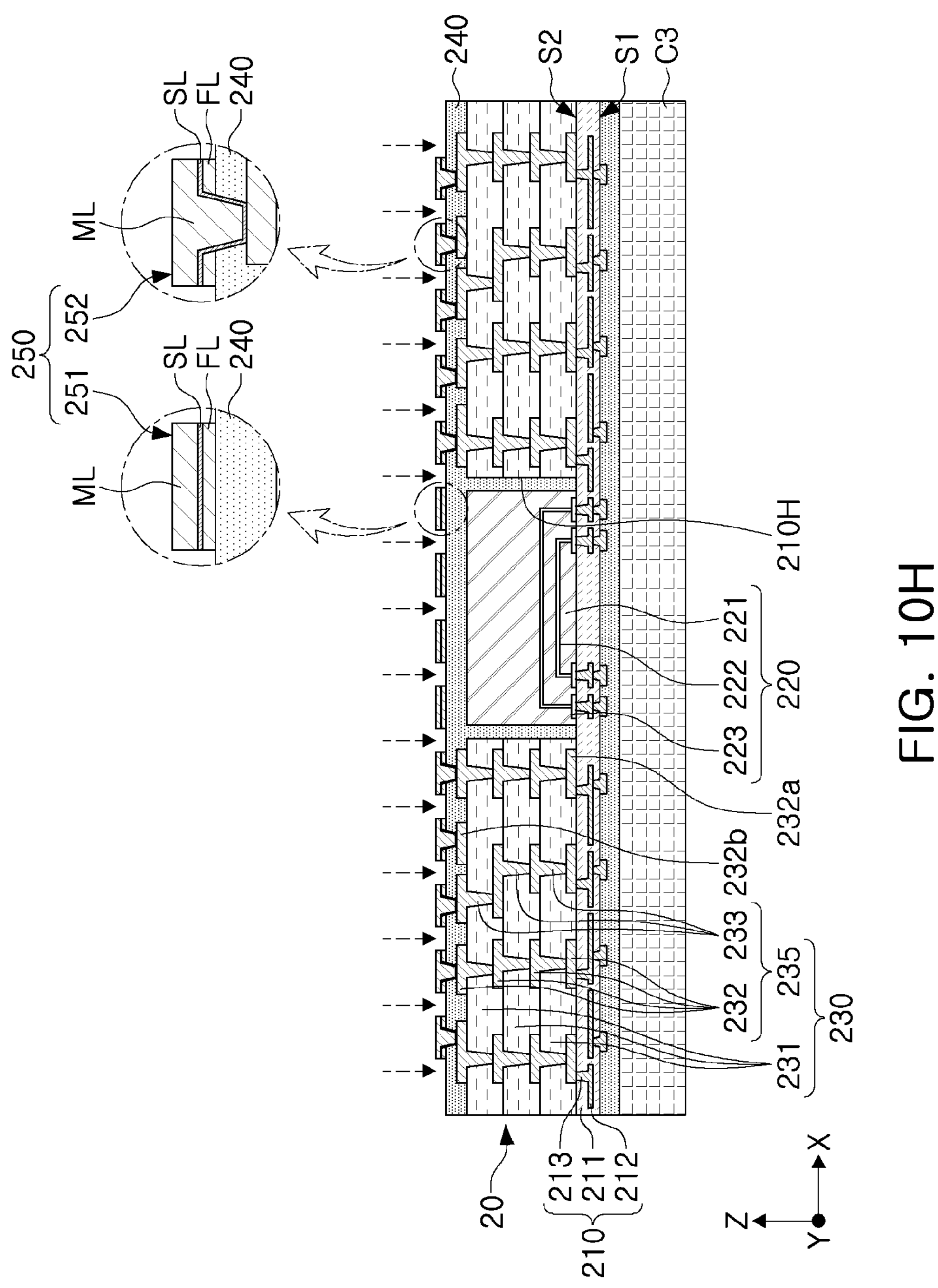

Referring to FIG. 10H, bump structures 250 may be formed by removing the photosensitive material layer PR and etching the preliminary seed layer SL and the preliminary foil layer FL exposed from the metal layer ML. The bump structures 250 may include a first bump structure 251, disposed in a fan-in region, and a second bump structure 252 disposed in a fan-out region. Each of the first bump structure 251 and the second bump structure 252 may have a three-layer structure including a foil layer FL', a seed layer SL, and a metal layer ML contacting the encapsulant 240. In some implementations, the second bump structure 252 may extend inwardly of the encapsulant 240 to contact the via structure 235.

Figure 10I:
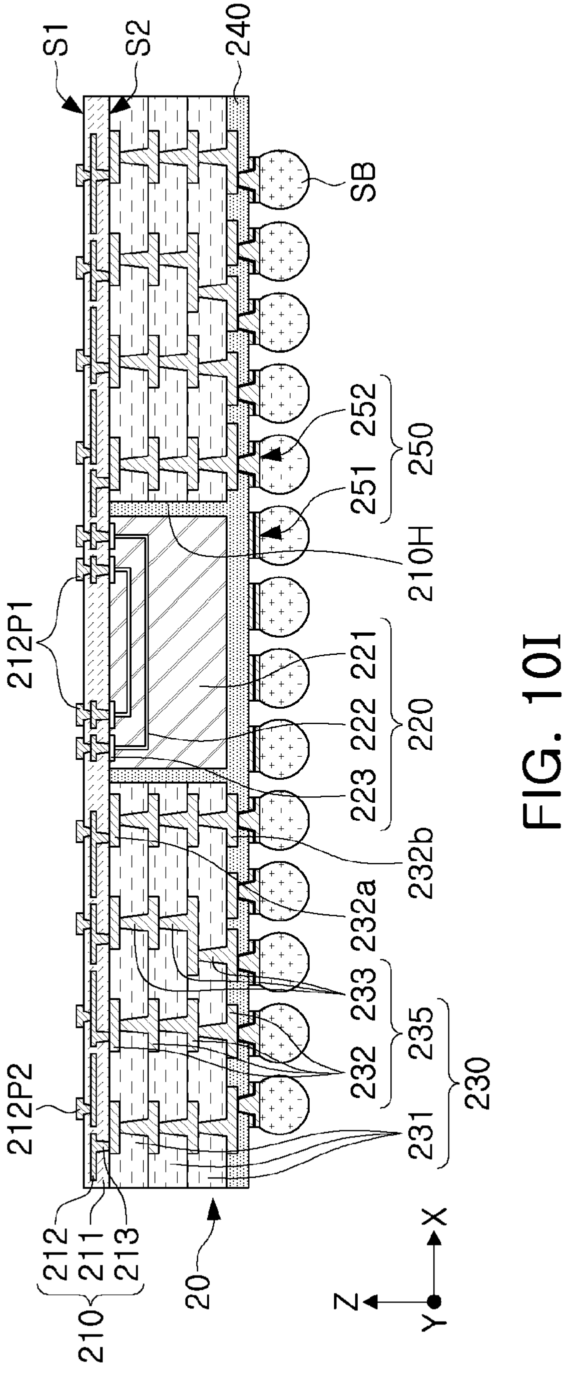

Referring to FIG. 10I, a solder ball may be attached to the bump structures 250, and chip structures (30 of FIG. 1B) may be mounted on the redistribution member 210. Through the above-described process, thicknesses of resin layers formed above and below the interconnect chip 220 may be controlled, and a substrate 20 with significantly reduced warpage and a semiconductor package having improved reliability may be manufactured.

As described above, a process of manufacturing bump structures may be simplified, and thus a semiconductor package having improved reliability and yield and a method of manufacturing the same may be provided.

While various examples have been shown and described above, it will be apparent to those skilled in the art that modifications and variations could be made without departing from the scope of the present inventive concept as defined by the appended claims.

What is claimed is:

1. A semiconductor package comprising:

a substrate including a redistribution member, wherein the redistribution member comprises a first surface and a second surface opposite of the first surface, pad structures disposed on the first surface, and a redistribution layer electrically connected to the pad structures, an interconnect chip disposed on the second surface of the redistribution member and including an interconnect circuit electrically connected to the redistribution layer, a via structure disposed around the interconnect chip and electrically connected to the redistribution layer, an encapsulant encapsulating at least a portion of each of the interconnect chip and the via structure, and bump structures disposed on the encapsulant; and a first chip structure and a second chip structure disposed on the first surface of the redistribution member and electrically connected to the pad structures, wherein the bump structures include a first bump structure, overlapping at least a portion of the interconnect chip in a first direction that is perpendicular to the second surface, and a second bump structure overlapping at least a portion of the via structure, the first bump structure includes a first foil layer that is disposed on the encapsulant and includes a first plating layer disposed on the first foil layer, and the second bump structure includes a second foil layer that is disposed on the encapsulant and includes a second plating layer disposed in an opening penetrating through the second foil layer to expose at least a portion of the via structure.

2. The semiconductor package of claim 1, wherein the first plating layer includes a first seed layer and a first metal layer contacting the first seed layer, wherein the first seed layer contacts the first foil layer.

3. The semiconductor package of claim 1, wherein the second plating layer includes a second seed layer and a second metal layer contacting the second seed layer, wherein the second seed layer contacts the second foil layer and extends along an inside of the opening.

4. A semiconductor package comprising:

a substrate including a redistribution member, wherein the redistribution member comprises a first surface and a second surface opposite of the first surface, pad structures disposed on the first surface, and a redistribution layer electrically connected to the pad structures, an interconnect chip disposed on the second surface of the redistribution member and including an interconnect circuit electrically connected to the redistribution layer, a via structure disposed around the interconnect chip and electrically connected to the redistribution layer, an encapsulant encapsulating at least a portion of each of the interconnect chip and the via structure, and bump structures disposed on the encapsulant; and a first chip structure and a second chip structure disposed on the first surface of the redistribution member and electrically connected to the pad structures, wherein the bump structures include a first bump structure, overlapping at least a portion of the interconnect chip in a first direction that is perpendicular to the second surface, and a second bump structure overlapping at least a portion of the via structure, the first bump structure includes a first foil layer that is disposed on the encapsulant and includes a first plating layer disposed on the first foil layer, and the second bump structure includes a second foil layer that is disposed on the encapsulant and includes a second plating layer disposed in an opening penetrating through the second foil layer to expose at least a portion of the via structure, wherein the redistribution member includes a dielectric layer providing the first surface and the second surface, and wherein a thickness of the encapsulant that covers the via structure ranges from about 80% to about 120% of a thickness of the dielectric layer.

5. The semiconductor package of claim 4, wherein the dielectric layer includes a photosensitive resin.

6. The semiconductor package of claim 4, wherein the thickness of the dielectric layer ranges from about 20 μm to about 30 μm.

7. The semiconductor package of claim 1, wherein the first and second chip structures are electrically connected to each other through the interconnect circuit.

8. The semiconductor package of claim 1, wherein the pad structures include first pad structures that are electrically connected to the interconnect circuit, wherein the pad structures include second pad structures electrically connected to the via structure, and wherein the first and second chip structures are electrically connected to each other through the first pad structures.

9. The semiconductor package of claim 8, wherein a first distance between adjacent first pad structures is shorter than a second distance between adjacent second pad structures.

10. The semiconductor package of claim 9, wherein the first distance ranges from about 10 μm to about 60 μm, and the second distance ranges from about 60 μm to about 100 μm.

11. The semiconductor package of claim 8, wherein a width of the first pad structures along a second direction that is parallel to the first surface is substantially a same width as the second pad structures along the second direction.

12. The semiconductor package of claim 1, wherein the pad structures include a pad portion that is disposed on the first surface, and wherein the pad structures include a surface layer disposed on the pad portion.

13. The semiconductor package of claim 1, comprising:

a connection member including the via structure and an insulating layer that surrounds the via structure, wherein the connection member includes a through-hole in which the interconnect chip is accommodated.

14. A semiconductor package comprising:

a substrate including a redistribution member, wherein the redistribution member comprises a first surface and a second surface opposite of the first surface, and a redistribution layer, an interconnect chip disposed on the second surface of the redistribution member and including an interconnect circuit electrically connected to the redistribution layer, a via structure disposed around the interconnect chip and electrically connected to the redistribution layer, an encapsulant encapsulating at least a portion of each of the interconnect chip and the via structure, and bump structures disposed on the encapsulant; and a first chip structure and a second chip structure disposed on the first surface of the redistribution member and electrically connected to the redistribution layer, wherein the bump structures include a foil layer that contacts the encapsulant, a seed layer that contacts the foil layer, and a metal layer that contacts the seed layer, and the foil layer, the seed layer, and the metal layer include a same material.

15. The semiconductor package of claim 14, wherein the foil layer, the seed layer, and the metal layer include copper (Cu) and a copper (Cu) alloy.

* * * * *